(12) United States Patent
Baek et al.

(10) Patent No.: US 11,915,965 B2
(45) Date of Patent: Feb. 27, 2024

(54) WAFER PROCESSING METHOD

(71) Applicant: ZEUS CO., LTD., Hwaseong-si (KR)

(72) Inventors: Seung Dae Baek, Hwaseong-si (KR); Sung Yup Kim, Suwon-si (KR); Jin Won Kim, Hwaseong-si (KR); Jae Hwan Son, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 0 days.

(21) Appl. No.: 17/865,851

(22) Filed: Jul. 15, 2022

(65) Prior Publication Data

US 2023/0046022 A1 Feb. 16, 2023

(30) Foreign Application Priority Data

Aug. 13, 2021 (KR) ........................ 10-2021-0107502

(51) Int. Cl.
*H01L 21/67* (2006.01)
*H01L 21/02* (2006.01)
*H01L 21/677* (2006.01)
*H01L 21/683* (2006.01)
*H01L 21/687* (2006.01)

(52) U.S. Cl.
CPC .. *H01L 21/68764* (2013.01); *H01L 21/67034* (2013.01); *H01L 21/67051* (2013.01); *H01L 21/67778* (2013.01); *H01L 21/6838* (2013.01)

(58) Field of Classification Search
CPC ................................................ H01L 21/00–86
See application file for complete search history.

(56) References Cited

U.S. PATENT DOCUMENTS

| | | | | |
|---|---|---|---|---|
| 2009/0114253 A1* | 5/2009 | Matsumoto | ....... | H01L 21/02052 134/30 |
| 2015/0364375 A1* | 12/2015 | Nakamura | .......... | H01L 21/6836 438/462 |
| 2018/0197776 A1* | 7/2018 | Ban | ...................... | H01L 23/3135 |
| 2022/0199411 A1* | 6/2022 | Takasaki | ................. | H01L 21/78 |

FOREIGN PATENT DOCUMENTS

| | | | |
|---|---|---|---|
| CN | 211125590 | | 7/2020 |
| CN | 115132618 | | 9/2022 |
| JP | 2020161618 | * | 10/2020 |
| KR | 10-2016-0122067 | | 10/2016 |
| KR | 20200122242 | * | 10/2020 |
| KR | 20210087201 | * | 7/2021 |

* cited by examiner

*Primary Examiner* — Mikhail Kornakov
*Assistant Examiner* — Richard Z. Zhang
(74) *Attorney, Agent, or Firm* — KILE PARK REED & HOUTTEMAN PLLC

(57) ABSTRACT

A wafer processing method of the present invention includes mounting a wafer part on a chuck table, loading the wafer part on the chuck table, spraying, by a spray arm module, a first processing solution onto the wafer part to process the wafer part, spraying, by the spray arm module, a second processing solution onto the wafer part to process the wafer part, drying the wafer part on the chuck table, and unloading the wafer part from the chuck table.

7 Claims, 31 Drawing Sheets

WAFER PROCESSING METHOD

CROSS-REFERENCE TO RELATED APPLICATION

This application claims priority to and the benefit of Korean Patent Application No. 10-2021-0107502, filed on Aug. 13, 2021, the disclosure of which is incorporated herein by reference in its entirety.

BACKGROUND

1. Field of the Invention

The present invention relates to a wafer processing method, and more particularly, to a wafer processing method capable of shortening a wafer part processing time and improving wafer part processing and cleaning performance.

2. Discussion of Related Art

In general, in a semiconductor process, an etching process of etching wafer parts, a singulation process of sawing the wafer parts into a plurality of dies, and a cleaning process of cleaning the wafer parts are performed. A wafer processing apparatus is used in the wafer etching process or the cleaning process.

The wafer processing apparatus includes a rotary table which is rotatably installed and on which a wafer part is mounted, and a sealing ring coupled to an edge area of the rotary table in a ring shape. A processing solution is supplied onto the wafer part mounted on the rotary table while the rotary table rotates A background technique of the present invention is disclosed in Korean Patent Publication No. 10-2016-0122067 (published on Oct. 21, 2016, and titled "Wafer processing apparatus and sealing ring for wafer processing apparatus").

SUMMARY OF THE INVENTION

The present invention is directed to providing a wafer processing method capable of shortening a wafer part processing time and improving wafer part processing and cleaning performance.

According to an aspect of the present invention, there is provided a wafer processing method including mounting a wafer part on a chuck table, loading the wafer part on the chuck table, spraying, by a spray arm module, a first processing solution onto the wafer part to process the wafer part, spraying, by the spray arm module, a second processing solution onto the wafer part to process the wafer part, drying the wafer part on the chuck table, and unloading the wafer part from the chuck table.

The mounting of the wafer part on the chuck table may include holding, by a transfer device, the wafer part transferred from a second transfer module, and lowering the transfer device to mount the wafer part on the chuck table.

The loading of the wafer part on the chuck table may include driving a chucking module of the chuck table and restraining, by a wafer restraining part, a retainer ring portion of the wafer part, and moving, by a moving module, a vacuum chuck unit of the chuck table and pulling the wafer part in a radial direction thereof to widen gaps between dies of the wafer part.

The unloading of the wafer part from the chuck table may include returning, by the moving module, the vacuum chuck unit of the chuck table to an original position thereof to restore the wafer part to an original state thereof, and driving the chucking module of the chuck table and releasing, by the wafer restraining part, restraint of the retainer ring portion of the wafer part.

The spraying of the first processing solution onto the wafer part to process the wafer part may include moving the spray arm module to be positioned above the wafer part, and swinging the spray arm module within a certain angle range to spray the first processing solution onto the wafer part.

The first processing solution may be pure water (deionized (DI) water).

The spraying of the second processing solution onto the wafer part to process the wafer part may include swinging the spray arm module within a certain angle range to spray the second processing solution onto the wafer part.

The second processing solution may be a mixture of pure water and nitrogen ($N_2$).

The drying of the wafer part on the chuck table may include moving the spray arm module outward from the chuck table, and rotating the chuck table to dry the wafer part.

DETAILED DESCRIPTION OF EXEMPLARY EMBODIMENTS

Figure 1:
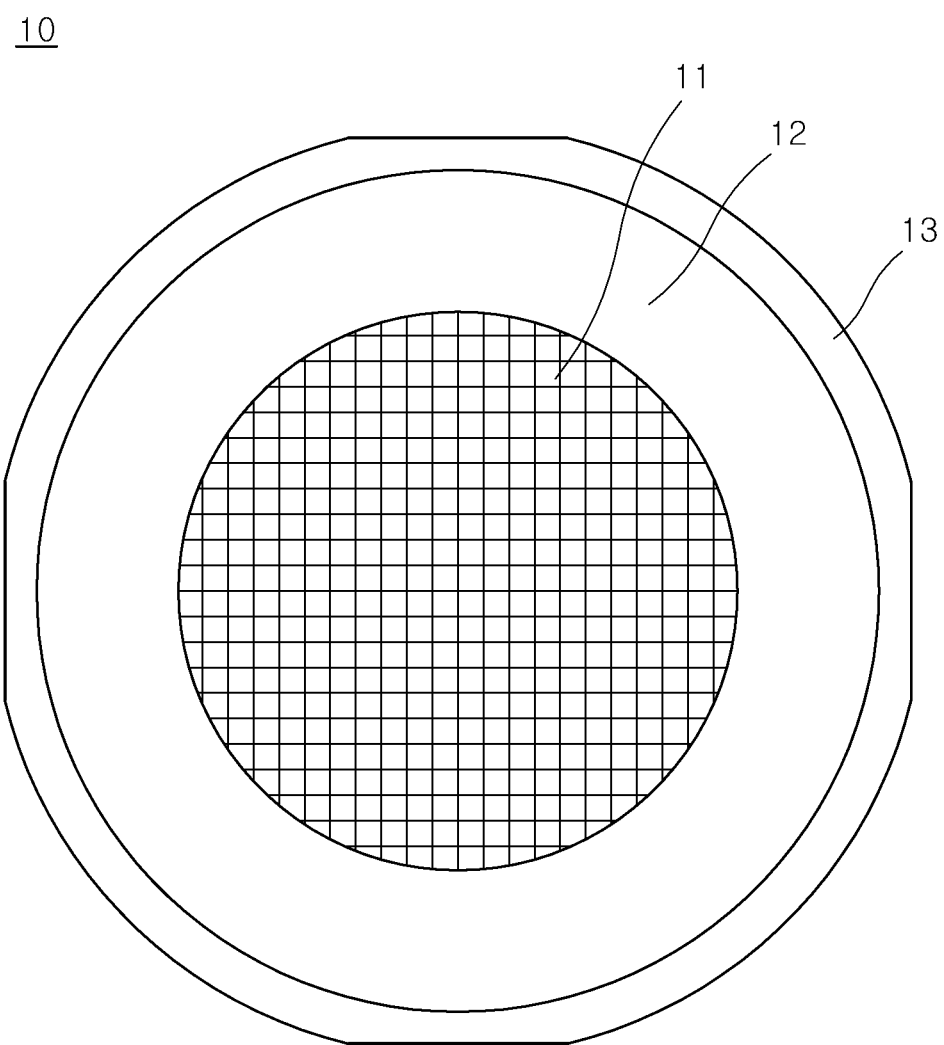
FIG. 1 is a schematic plan view illustrating a wafer part according to one embodiment of the present invention.

Hereinafter, embodiments of a wafer processing method according to the present invention will be described with reference to the accompanying drawings. In describing the wafer processing method, thicknesses of lines or sizes of components shown in the drawings may be exaggerated for the sake of convenience and clarity in description Furthermore, terminologies used herein are defined by taking functions of the present invention into account and may be changed according to a custom or the intent of a user or an operator. Accordingly, the terminologies should be defined based on the following overall description of the present specification.

Figure 2:
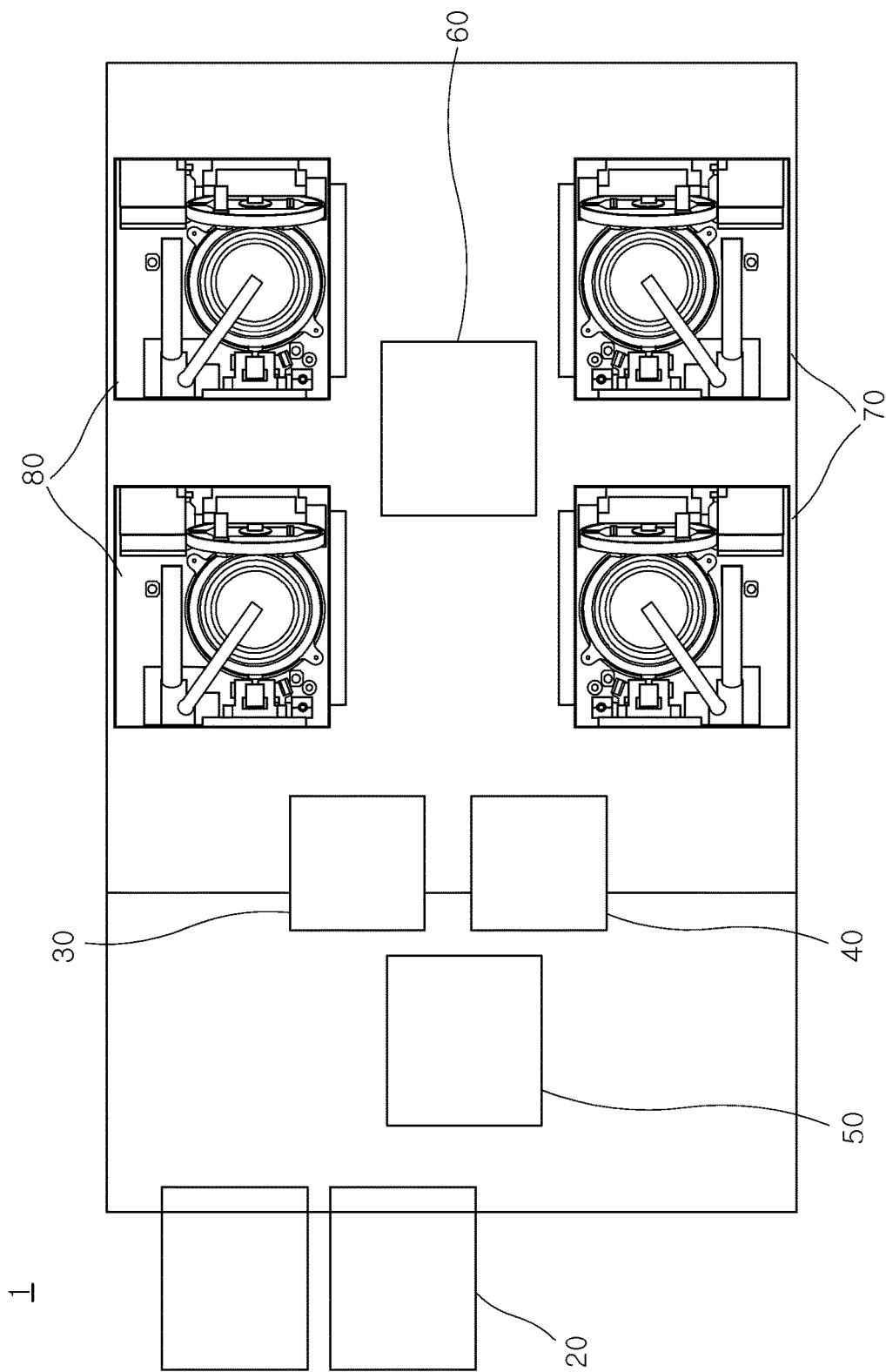
FIG. 2 is a schematic block diagram illustrating a wafer processing apparatus according to one embodiment of the present invention.
Figure 3A:
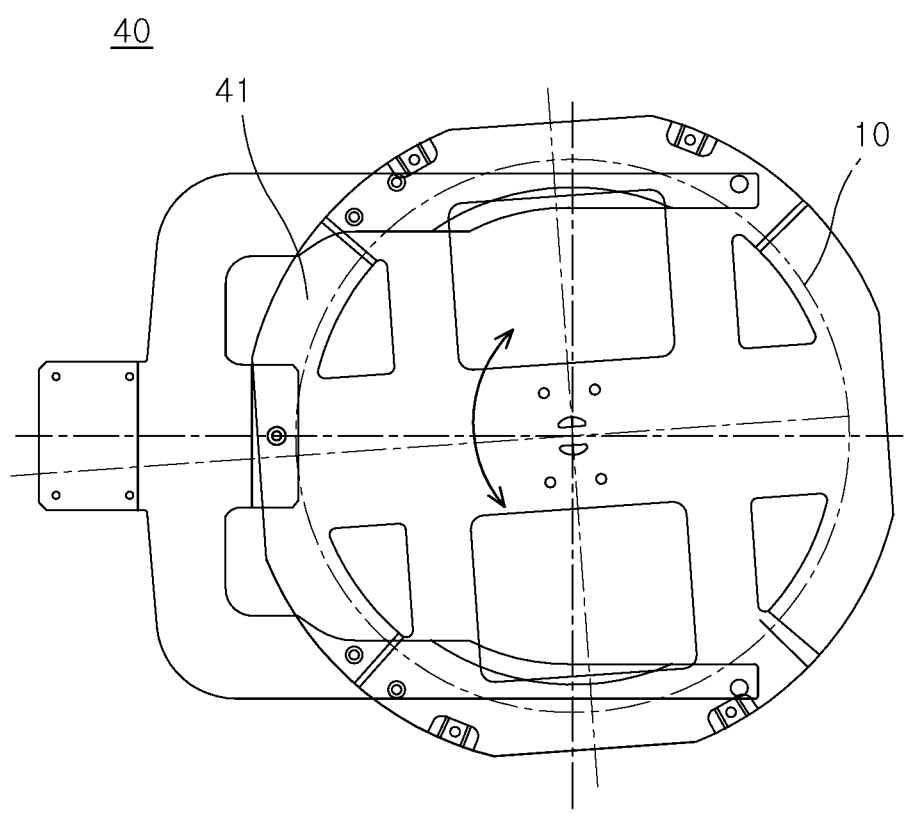
FIGS. 3A and 3B show schematic plan views illustrating a vision aligner in the wafer processing apparatus according to one embodiment of the present invention.
Figure 3B:
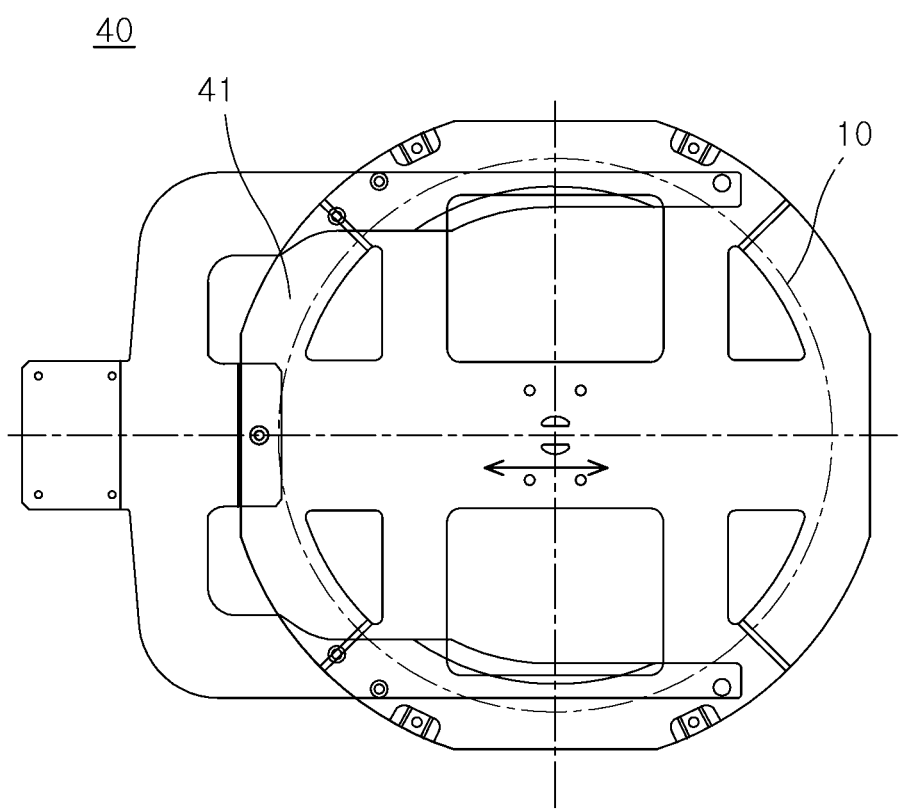

FIG. 1 is a schematic plan view illustrating a wafer part according to one embodiment of the present invention. FIG. 2 is a schematic block diagram illustrating a wafer processing apparatus according to one embodiment of the present invention. FIGS. 3A and 3B show schematic plan views illustrating a vision aligner in the wafer processing apparatus according to one embodiment of the present invention.

Referring to FIGS. 1 to 3B, a wafer processing apparatus 1 according to one embodiment of the present invention processes a wafer part 10. A ring frame wafer part 10 etched in an etching process is sawn in the form of a matrix in a singulation process. The ring frame wafer part 10 includes a wafer 11 including a plurality of dies sawn and arranged in the form of a matrix, an adhesive sheet 12 to which the wafer 11 is attached, and a retainer ring portion 13 connected to a circumferential portion of the adhesive sheet 12 to tightly support the adhesive sheet 12. The adhesive sheet 12 is made of a material that is stretchable or contractible in a horizontal direction. The adhesive sheet 12 is pulled tight by the retainer ring portion 13 so that the plurality of dies are positioned and fixed, and the die, which is a thin plate, maintains a flat plate shape. Hereinafter, the ring frame wafer part 10 will be referred to as the wafer part 10.

A wafer cassette 20 is a front opening unified pod (FOUP) which has an internal space sealed from the outside, in which a plurality of wafer parts 10 are loaded, and which, along with the wafer part 10, moves between unit process apparatuses. The wafer cassette 20 transferred to the unit process apparatus is mounted on an upper surface of a load port module (not shown) disposed at one side of the unit process apparatus, and while an internal space of the wafer cassette 20 is sealed from the outside, a wafer part cassette door (not shown) is opened. Accordingly, the wafer part 10 can be prevented from being contaminated from an external environment and can be moved between the unit process apparatuses.

The wafer part 10 loaded in the wafer cassette 20 is adsorbed by a first transfer module 50 and loaded on a buffer unit 30. The buffer unit 30 includes two pre-slots (not shown) and two post-slots (not shown). As the first transfer module 50, a vacuum adsorption robot for adsorbing the wafer part 10 using a vacuum may be applied.

The wafer part 10 loaded on the buffer unit 30 is mounted on a vision aligner 40 by the first transfer module 50. The vision aligner 40 includes an aligner table 41 on which the wafer part 10 is mounted, and a vision unit (not shown) which reads the wafer part 10 by irradiating light onto the aligner table 41. The vision aligner 40 may rotate at an angle of about 4° with respect to a center of the aligner table 41 and may laterally move to a distance of about 7 mm with respect to the center of the aligner table 41. The vision unit may read a position of the wafer part 10 and a center of the wafer 11 to align the position of the wafer part 10. In this case, the vision unit reads whether the center of the wafer 11 and a center of the retainer ring portion match each other and aligns the wafer part 10 such that the center of the wafer 11 is aligned at a correct position.

The wafer part 10 aligned in the vision aligner 40 is loaded into a first processing chamber 70 and a second processing chamber 80 by a second transfer module 60. In the first processing chamber 70, a processing solution is sprayed onto the wafer part 10 to process the wafer part 10. A plurality of second processing chambers 80 are installed.

In the second processing chamber 80, a processing solution is sprayed onto the wafer part 10, and simultaneously, foreign materials floating on an upper side of the processing solution are suctioned to process the wafer part 10.

Figure 4:
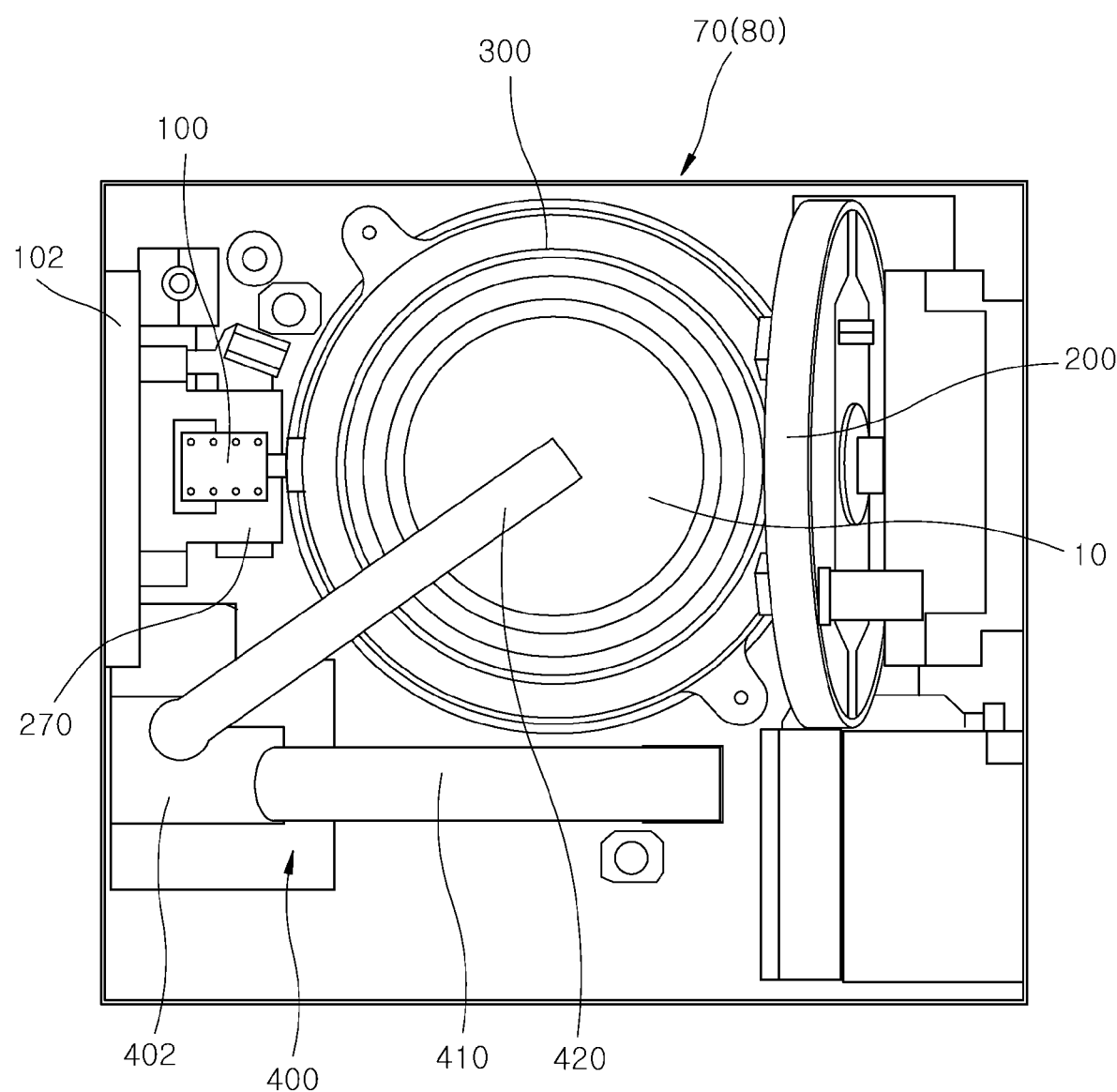
FIG. 4 is a schematic plan view illustrating a first processing chamber and a second processing chamber in the wafer processing apparatus according to one embodiment of the present invention.

FIG. 4 is a schematic plan view illustrating the first processing chamber and the second processing chamber in the wafer processing apparatus according to one embodiment of the present invention.

Referring to FIG. 4, an ionizer 102, a transfer device 100, a tilting device 200, a chuck table device 300, a spray device 400, and a suction device 500 are installed in the first processing chamber 70. An ionizer 102, a transfer device 100, a tilting device 200, a chuck table device 300, and a spray device 400 are installed in the second processing chamber 80.

The ionizer 102 is installed above each of the first processing chamber 70 and the second processing chamber 80. The ionizer 102 removes static electricity generated during a processing process and a non-processing process of the wafer part 10. Since the ionizer 102 prevents static electricity from being generated on the wafer part 10 and inside the first processing chamber 70 and the second processing chamber 80, foreign materials can be prevented from being reattached to the wafer part 10 by static electricity.

When air as a supply gas is supplied to the ionizer 102 and deionized water (DI water) as a cleaning solution is supplied, positive ions and negative ions ionized through the ionizer 102, along with the cleaning solution, may be sprayed onto the wafer part 10.

Before DI water including positive ions and negative ions is sprayed onto the wafer part 10, an electrostatic potential of the wafer part 10 was measured to be approximately 3.6 kV. On the other hand, after DI water including positive ions and negative ions is sprayed onto the wafer part 10, the electrostatic potential was measured to be in a range of about −0.10 kV to −0.17 kV. The electrostatic potential of such a negative voltage causes an amount of positive ions to be increased by the ionizer 102, thereby controlling the static electricity of the wafer part 10 to be close to "zero" which is an ideal value.

Figure 5:
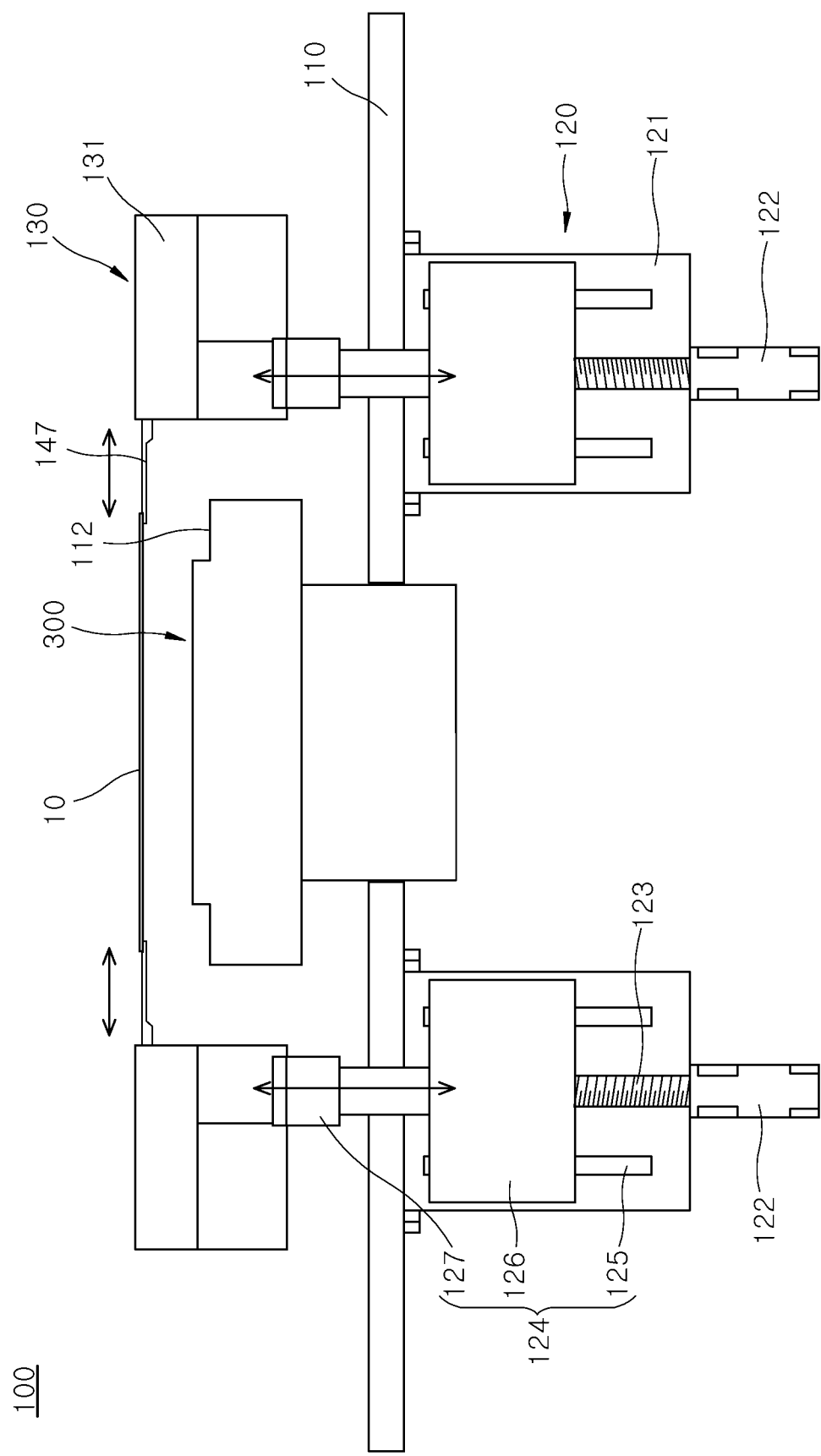
FIG. 5 is a schematic side view illustrating a transfer device in the wafer processing apparatus according to one embodiment of the present invention.
Figure 6:
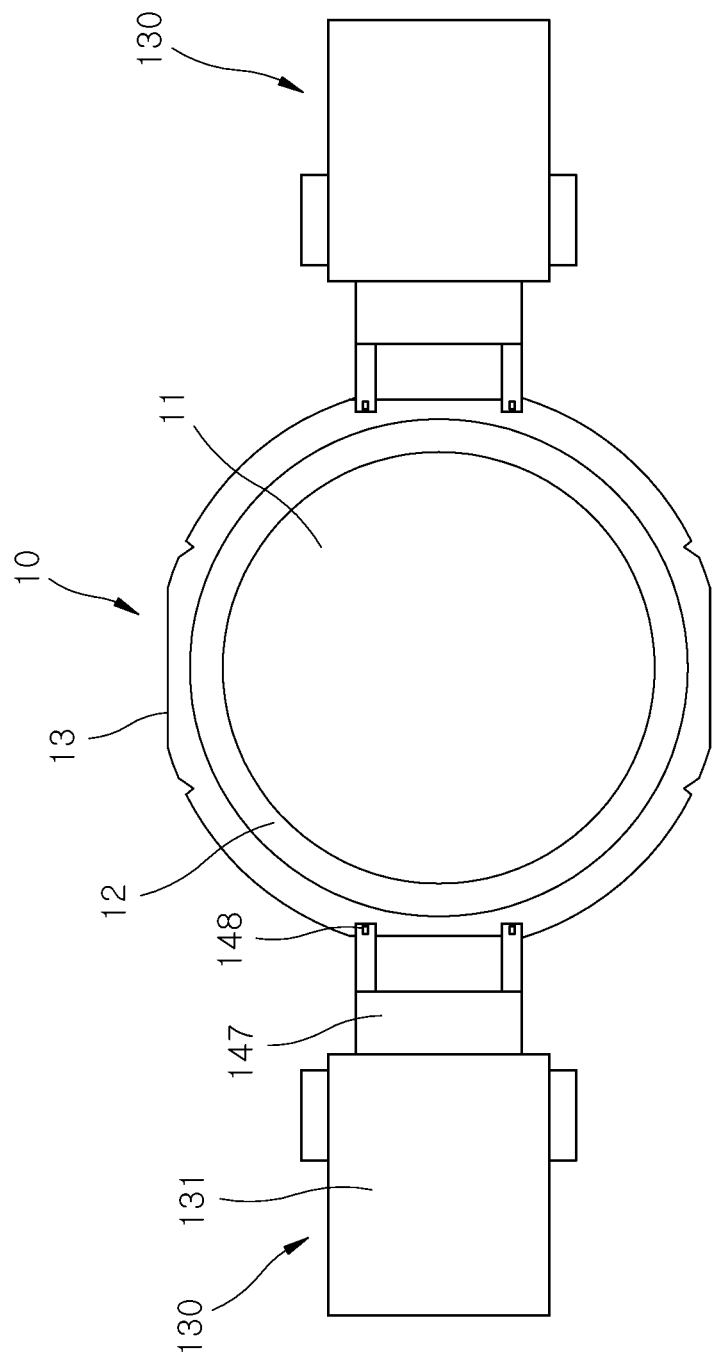
FIG. 6 is a schematic plan view illustrating the transfer device in the wafer processing apparatus according to one embodiment of the present invention.
Figure 7:
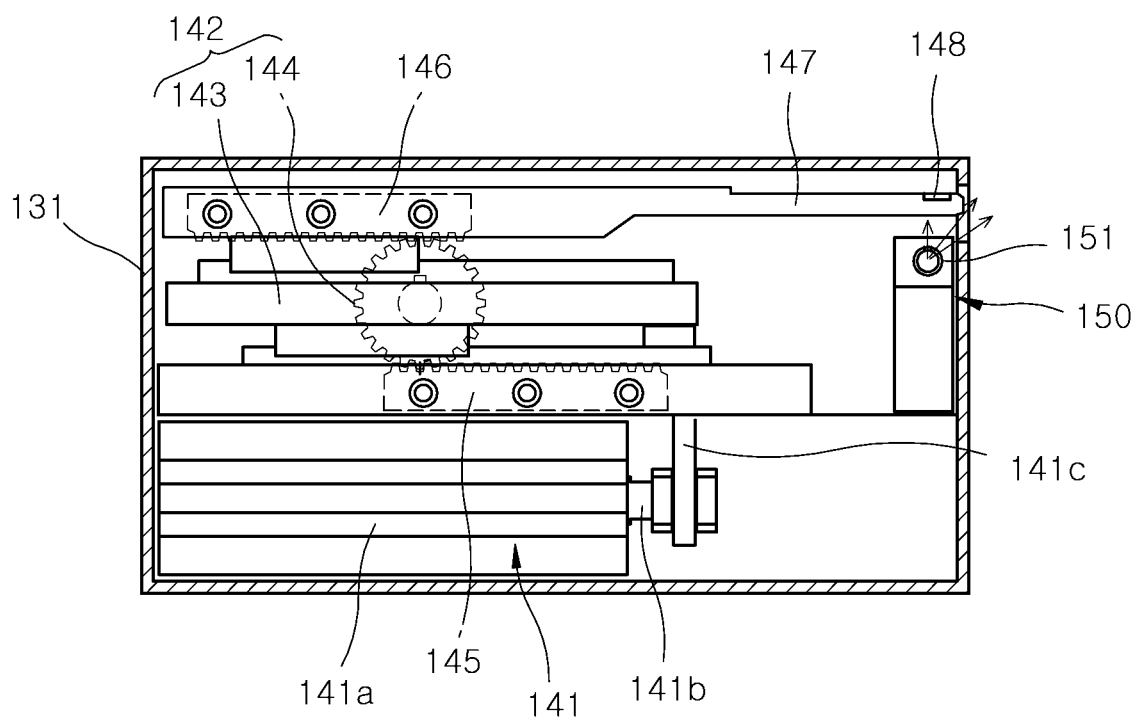
FIG. 7 is a schematic side view illustrating a gripper unit in the transfer device of the wafer processing apparatus according to one embodiment of the present invention.
Figure 8:
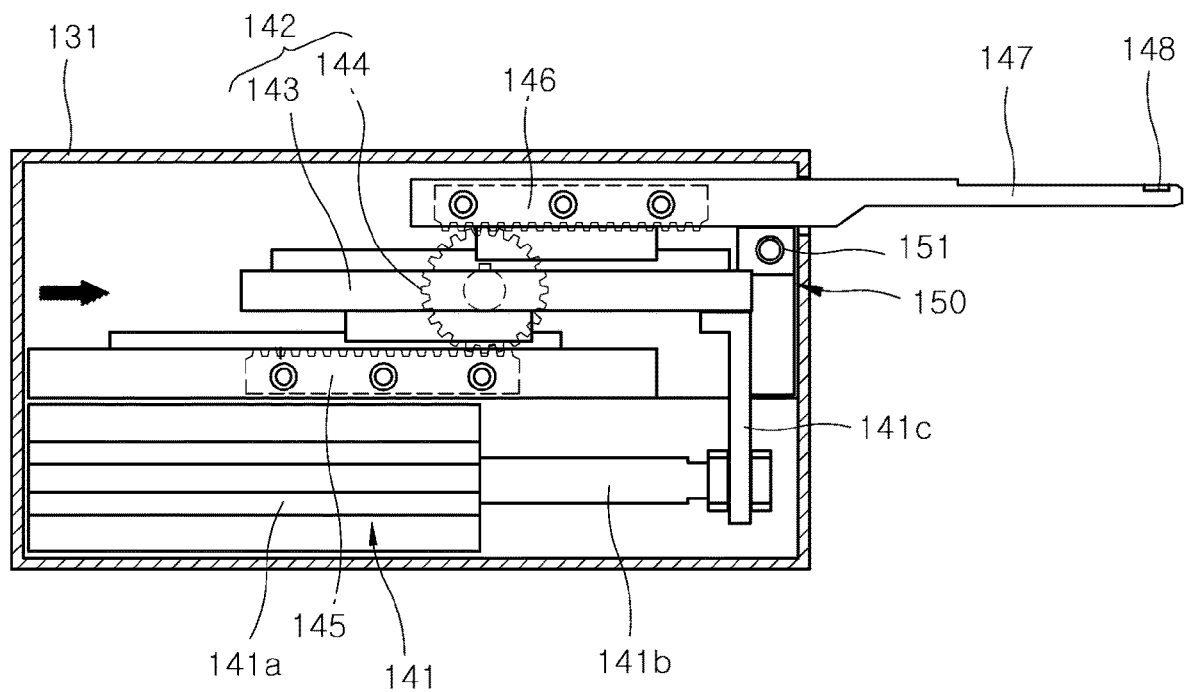
FIG. 8 is a schematic side view illustrating a state in which the gripper unit is drawn out of the transfer device of the wafer processing apparatus according to one embodiment of the present invention.

FIG. 5 is a schematic side view illustrating the transfer device in the wafer processing apparatus according to one embodiment of the present invention. FIG. 6 is a schematic plan view illustrating the transfer device in the wafer processing apparatus according to one embodiment of the present invention. FIG. 7 is a schematic side view illustrating a gripper unit in the transfer device of the wafer processing apparatus according to one embodiment of the present invention. FIG. 8 is a schematic side view illustrating a state in which the gripper unit is drawn out of the transfer device of the wafer processing apparatus according to one embodiment of the present invention.

Referring to FIGS. 5 to 8, the transfer device 100 is installed at both sides of the chuck table device 300. The transfer device 100 mounts the wafer part 10 transferred from the second transfer module 60 on the chuck table device 300.

The transfer device 100 includes a lifting unit 120, a transfer unit 130, and a gripper unit 140.

The lifting unit 120 is installed outside a chuck table 320 and 330. One pair of lifting units 120 are installed at both sides of the chuck table 320 and 330 in a radial direction. The lifting unit 120 is installed under a base unit 110. As the lifting unit 120, any type such as a ball screw type, a linear motor type, or a belt driving type may be applied.

The transfer unit 130 is connected to the lifting unit 120 to be lifted or lowered by the lifting unit 120 and is disposed outside the chuck table 320 and 330. The transfer unit 130 is installed at each of the lifting units 120. The transfer unit 130 is installed above the base unit 110.

The gripper unit 140 is reciprocally installed in the transfer unit 130 to hold or place the wafer part 10. The gripper unit 140 is installed in each of one pair of transfer units 130. One pair of gripper units 140 support both sides of a ring frame portion 15 of the wafer part 10. The gripper unit 140 receives the wafer part 10 transferred by the second transfer module 60 and is lowered by the lifting unit 120 to mount the gripper unit 140 on the chuck table 320 and 330.

Since the lifting unit 120 and the transfer unit 130 are disposed outside the chuck table 320 and 330, and the gripper unit 140 is disposed vertically parallel to the lifting unit 120 and the transfer unit 130, it is possible to considerably reduce an installation space of the gripper unit 140 and a movement path of the gripper unit 140. Accordingly, even in a narrow space, the wafer part 10 can be received from the second transfer module 60 and mounted on the chuck table 320 and 330, and the processed wafer part 10 can be unloaded from the chuck table 320 and 330.

The lifting unit 120 includes a lifting arm driving part 122 disposed under the transfer unit 130, a power transmission part 123 connected to the lifting arm driving part 122, and a linear guide part 124 connected to the power transmission part 123 to lift or lower the transfer unit 130. The lifting arm driving part 122 may be disposed outside a case unit 121, and the power transmission part 123 and the linear guide part 124 may be disposed inside the case unit 121. When the lifting arm driving part 122 transmits power to the power transmission part 123, the linear guide part 124 may be lifted or lowered in the case unit 121 to vertically move the transfer unit 130.

A motor part may be applied as the lifting arm driving part 122. The power transmission part 123 may be a ball screw rotated by the lifting arm driving part 122.

The linear guide part 124 includes fixed guide portions 125 vertically disposed in parallel on the lifting arm driving part 122, a moving guide portion 126 coupled to the fixed guide portion 125 to be lifted or lowered and connected to the power transmission part 123 to be movable by the power transmission part 123, and a lifting rod 127 connected to the moving guide portion and the transfer unit 130. The fixing guide portions 125 may be fixed rail portions vertically disposed in parallel inside the case unit 121. The moving guide portion 126 may be slidably coupled to the fixed guide portion 125. The lifting rod 127 is installed in the case unit 121 to be vertically movable. When the lifting arm driving part 122 is driven, the moving guide portion 126 is moved along the fixed guide portion 125, and the lifting rod 127 is moved by the moving guide portion 126. Accordingly, a vertical stroke of the transfer unit 130 can be accurately controlled.

The gripper unit 140 includes a gripper driving part 141, at least one pinion portion 142, a plurality of rack gear portions 145 and 146, and a finger part 147.

The gripper driving part 141 is installed in the transfer unit 130. As the gripper driving part 141, any form such as a hydraulic cylinder, a ball screw, or a belt driving type motor part may be applied.

At least one pinion portion 142 is installed to be connected to the gripper driving part 141 and be movable by the gripper driving part 141.

The plurality of rack gear portions 145 and 146 are installed to be engaged with the pinion portion 142 and are moved by the rotation of the pinion portion 142. The rack gear portions 145 and 146 are movably installed at both sides of the pinion portion 142. When one pinion portion 142 is installed, two rack gear portions 145 and 146 may be installed to be engaged with both sides of the pinion portion 142. When two pinion portions 142 are installed, three rack gear portions 145 and 146 may be installed to be engaged with both sides of the pinion portions 142.

The finger part 147 extends from one rack gear portion 146 to hold the wafer part 10. In this case, the finger part 147 is installed at one rack gear portion 146 that is moved farthest from the transfer unit 130 when the gripper driving part 141 is driven.

Hereinafter, the gripper unit 140 in which one pinion portion 142 and two rack gear portions 146 are installed will be described.

A pinion tooth portion (not shown) is formed on an outer surface of the pinion portion 142. In this case, the plurality of rack gear portions 145 and 146 include a first rack gear portion 145 which is installed to be engaged with the pinion portion 142 and reciprocates by the rotation of pinion portion 142 and a second rack gear portion 146 which is installed to be engaged with the pinion portion 142 and reciprocates by the rotation of the pinion portion 142 and from which the finger part 147 extends. In this case, the pinion portion 142 is disposed between the first rack gear portion 145 and the second rack gear portion 146. In addition, the pinion tooth portion of the pinion portion 142 is installed to be engaged with an upper side of the first rack gear portion 145 and a lower side of the second rack gear portion 146.

The first rack gear portion 145 is fixed to a housing unit 131 of the transfer unit 130, and the second rack gear portion 146 is moved by the translation and rotation of the pinion portion 142. When the gripper driving part 141 is driven, the pinion portion 142 simultaneously performs translational motion and rotational motion along the first rack gear portion 145 so that the second rack gear portion 146 moves to a certain distance by the translational motion and rotational motion of the pinion portion 142. Accordingly, the second rack gear portion 146 may move to a distance about twice a distance by which the gripper driving part 141 moves the pinion portion 142 so that a stroke of the finger part 147 may considerably increase as compared with a stroke of the gripper driving part 141.

The pinion portion 142 includes a slider portion 143 which is connected to the gripper driving part 141 and is installed between the first rack gear portion 145 and the second rack gear portion 146 to reciprocate and a pinion gear portion 144 which is rotatably coupled to the slider portion 143 and moves the second rack gear portion 146 while moving together with the slider portion 143. The slider portion 143 is disposed parallel with the first rack gear portion 145 and the second rack gear portion 146. When the gripper driving part 141 is driven, the pinion gear portion 144 performs translational motion in a linear direction together with the slider portion 143 and is engaged with the first rack gear portion 145 to perform rotational motion.

The gripper driving part 141 includes a cylinder 141a installed in the transfer unit 130, a moving rod 141b movably installed in the cylinder 141a, and a connection link portion 141c connected to the moving rod 141b and the slider portion 143. The connection link portion 141c extends upward from the moving rod 141b of the cylinder 141a to be connected to the slider portion 143. The connection link portion 141c is moved in a linear direction by the moving rod 141b of the cylinder 141a. As the moving rod 141b is moved, the slider portion 143 is moved.

The finger part 147 includes a vacuum adsorption part 148 which holds the wafer part 10 through vacuum adsorption. Two or more vacuum adsorption parts 148 may be installed in the finger part 147. The vacuum adsorption part 148 vacuum-adsorbs the ring frame portion 15 of the wafer part 10. A vacuum flow path (not shown) may be formed inside the finger part 147 to form a vacuum in the vacuum adsorption part 148.

Figure 9:
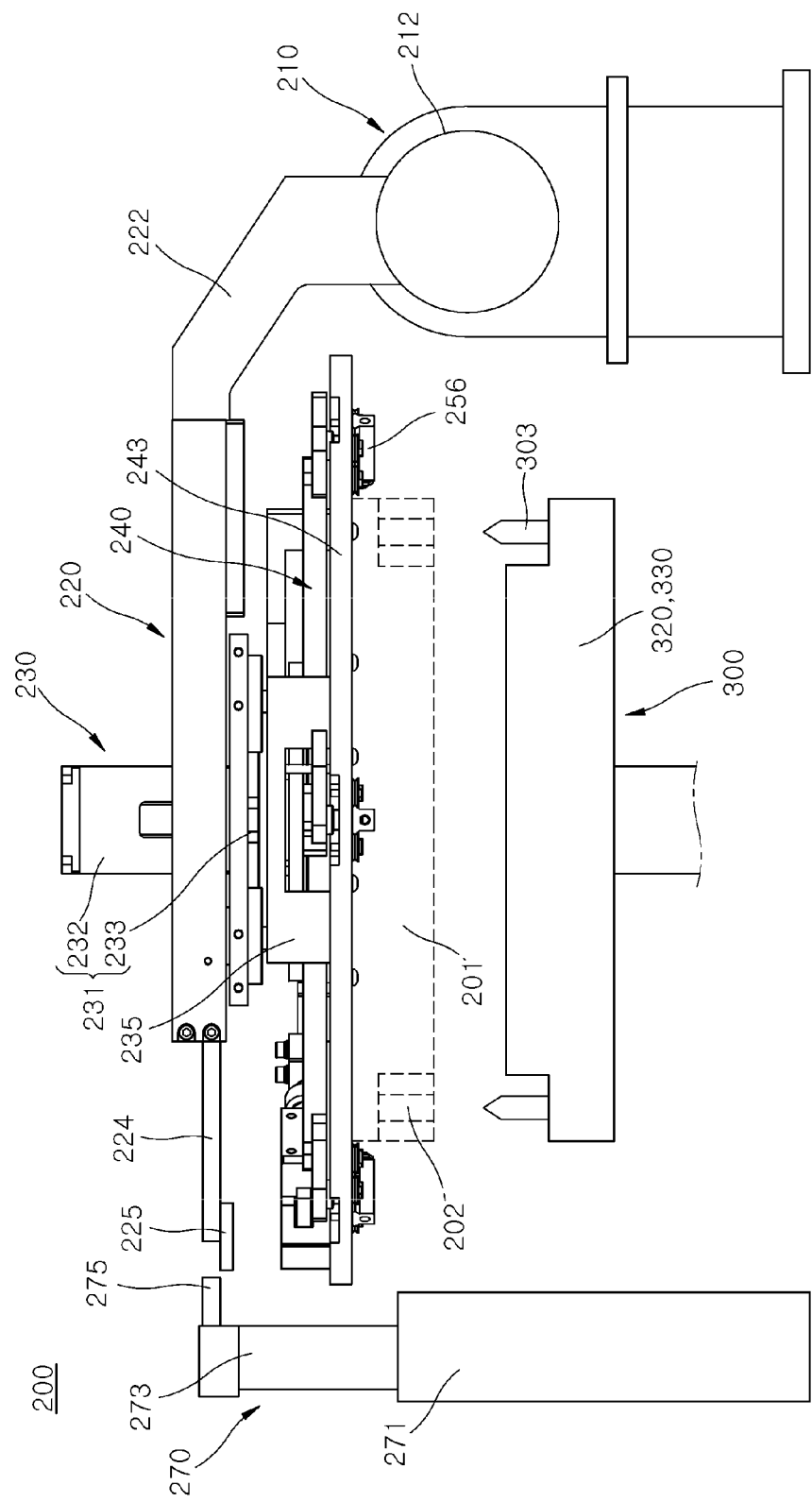
FIG. 9 is a schematic side view illustrating a tilting device in the wafer processing apparatus according to one embodiment of the present invention.
Figure 10:
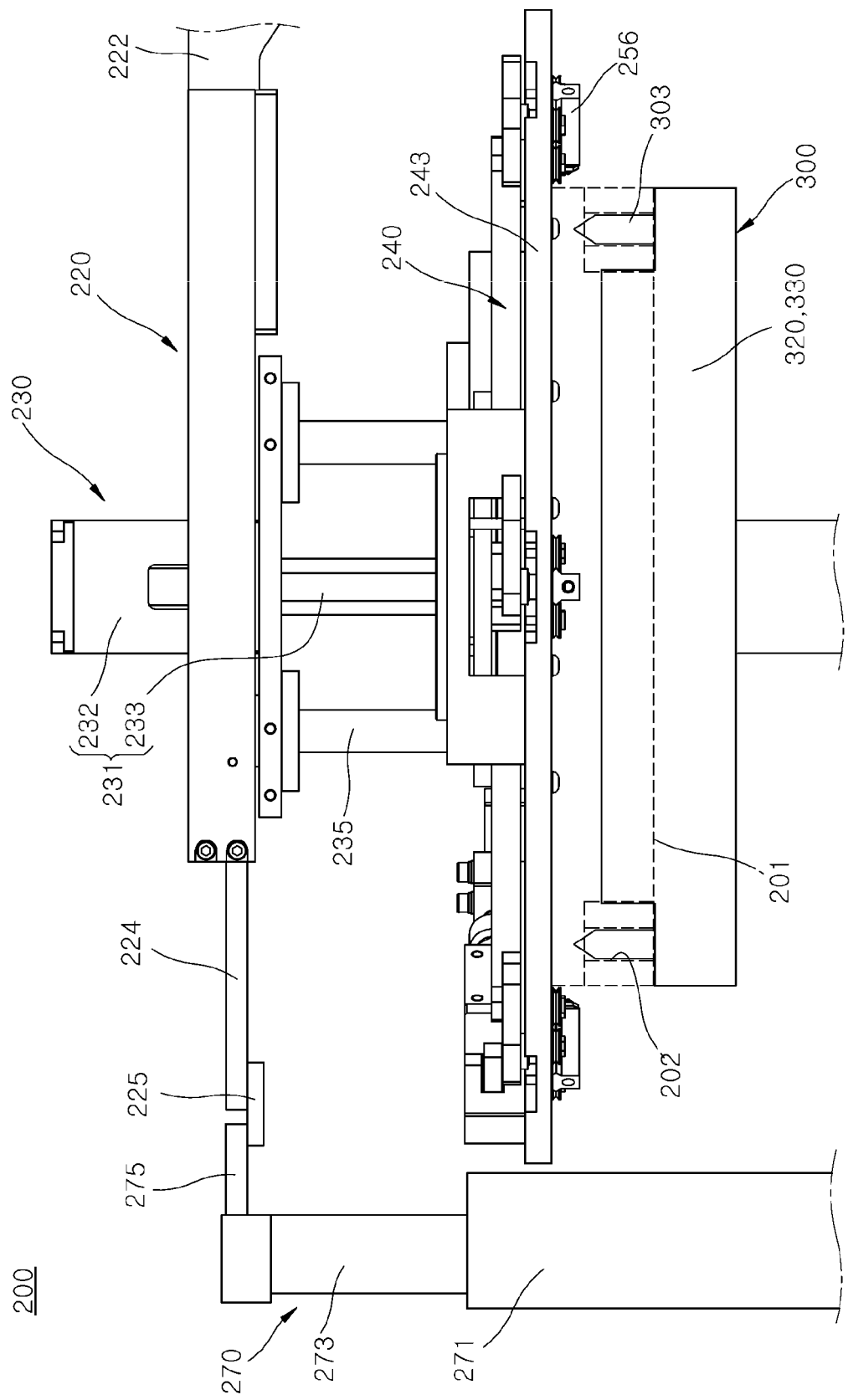
FIG. 10 is a schematic side view illustrating a state in which a holding unit is lowered in the tilting device of the wafer processing apparatus according to one embodiment of the present invention.
Figure 11:
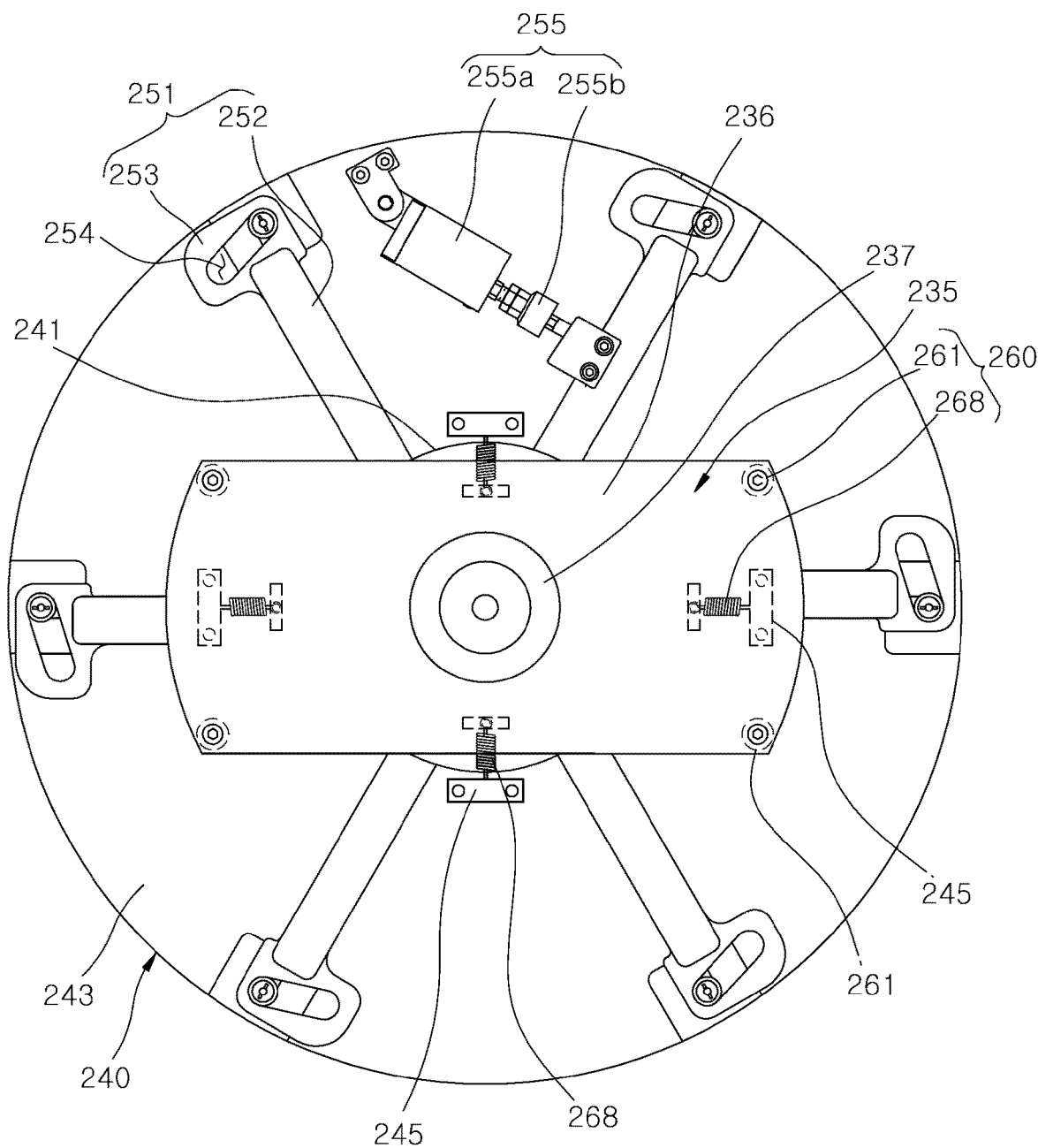
FIG. 11 is a schematic plan view illustrating the holding unit of the tilting device in the wafer processing apparatus according to one embodiment of the present invention.
Figure 12:
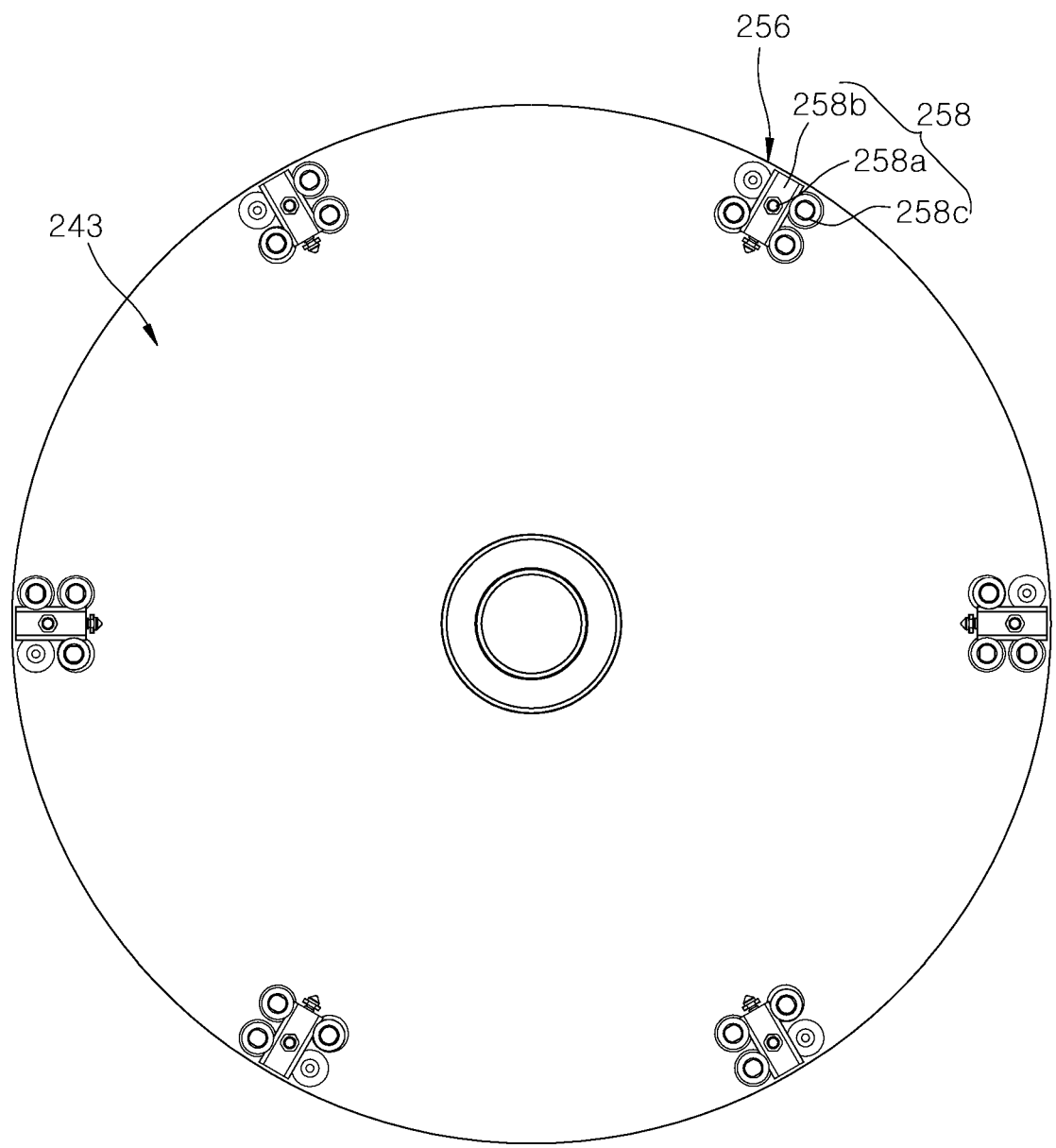
FIG. 12 is a schematic rear view of the holding unit of the tilting device in the wafer processing apparatus according to one embodiment of the present invention.
Figure 13:
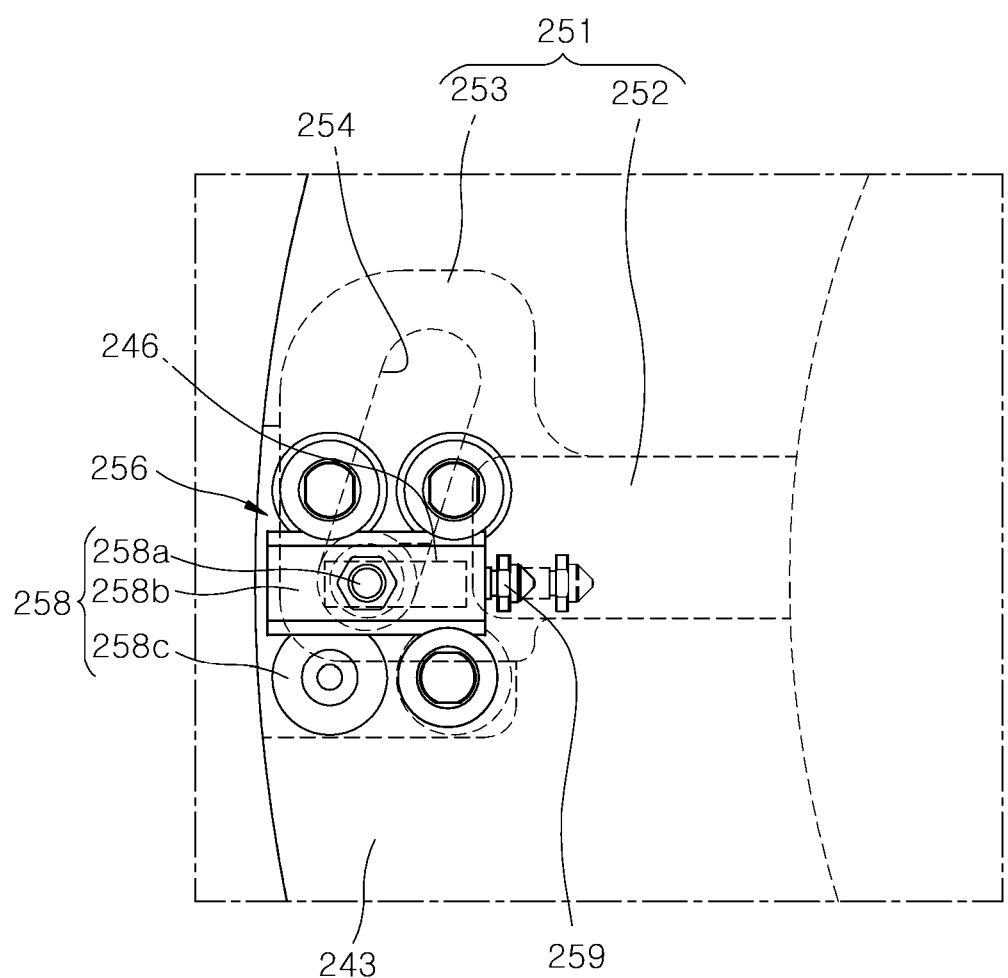
FIG. 13 is a schematic enlarged view illustrating the holding unit of the tilting device in the wafer processing apparatus according to one embodiment of the present invention.

FIG. 9 is a schematic side view illustrating a tilting device in the wafer processing apparatus according to one embodiment of the present invention. FIG. 10 is a schematic side view illustrating a state in which a holding unit is lowered in the tilting device of the wafer processing apparatus according to one embodiment of the present invention. FIG. 11 is a schematic plan view illustrating the holding unit of the tilting device in the wafer processing apparatus according to one embodiment of the present invention. FIG. 12 is a schematic rear view of the holding unit of the tilting device in the wafer processing apparatus according to one embodiment of the present invention. FIG. 13 is a schematic enlarged view illustrating the holding unit of the tilting device in the wafer processing apparatus according to one embodiment of the present invention.

Referring to FIGS. 9 to 13, a tilting device 200 includes a tilting motor unit 210, a tilting unit 220, a lifting unit 230, and a holding unit 240.

The chuck table device 300 is installed under the tilting device 200. The chuck table device 300 is installed to be rotatable by a chuck driving unit 310. As the chuck driving unit 310, a motor unit such as a belt driving type or a gear driving type may be applied.

The chuck table device 300 is installed on a rotating shaft 311 to be rotated by the rotating shaft 311. A wafer part 10 such as the wafer part 10 is mounted on a vacuum chuck unit 330. A plurality of chuck pins 303 are installed to protrude from a circumferential portion of the vacuum chuck unit 330 and fix a ring cover unit 201.

The tilting device 200 holds the ring cover unit 201 and couples the ring cover unit 201 to the chuck table device 300. A plurality of fixing holes 202 are formed in a lower portion of a circumferential portion of the ring cover unit 201 such that the plurality of chuck pins 303 are inserted therein when the ring cover unit 201 is seated on the chuck table device 300. In addition, a plurality of restraining grooves 203 are formed in an outer surface of the circumferential portion of the ring cover unit 201 to be held by the holding unit 240. The plurality of restraining grooves 203 are formed to face locking pins 259 of the holding unit 240. The ring cover unit 201 seals a circumferential portion of the wafer part 10 mounted on the vacuum chuck unit 330 to prevent a processing solution from permeating into the circumferential portion of the wafer part 10 and the ring cover unit 201 when the wafer part 10 is processed.

The tilting unit 220 is rotatably connected to a tilting shaft 212 of the tilting motor unit 210. A tilting arm 222 is formed in the tilting unit 220 to be connected to the tilting shaft 212 of the tilting motor unit 210. The tilting unit 220 maintains a state of being erected upward in a standby state. The tilting motor unit 210 horizontally rotates the tilting unit 220 to be positioned above the vacuum chuck unit 330 when the ring cover unit 201 is coupled to the circumferential portion of the vacuum chuck unit 330. A setting module (not shown) capable of setting the initial position of the holding unit 240 in a horizontal direction is installed in the tilting unit 220 to horizontally position the holding unit 240 at the coupling position of the ring cover unit 201.

The lifting unit 230 is installed in the tilting unit 220. The lifting unit 230 is installed in a central portion of the tilting unit 220. A lifting rod 233 of the lifting unit 230 is installed to pass through the central portion of the tilting unit 220. A plurality of lifting guide portions are installed in the tilting unit 220 to guide the lifting and lowering of the lifting unit 230.

The holding unit 240 is connected to the lifting unit 230 to be lifted or lowered by the lifting unit 230 and holds the ring cover unit 201. Before the wafer part 10 is mounted on the vacuum chuck unit 330, the holding unit 240 is positioned in a standby state in which the holding unit 240 is vertically erected while holding the ring cover unit 201.

When the wafer part 10 is mounted on the vacuum chuck unit 330, as the tilting motor unit 210 is driven, the tilting unit 220 and the holding unit 240 are horizontally rotated. When the rotation of the tilting unit 220 and the holding unit 240 is completed, as the lifting unit 230 is driven, the holding unit 240 is moved under the tilting unit 220. In this case, the tilting unit 220 is not lowered together with the lifting unit 230 and maintains a horizontal state without any change.

The holding unit 240 is lowered to mount the ring cover unit 201 on the vacuum chuck unit 330. In order to continuously maintain a state in which the ring cover unit 201 is coupled to the vacuum chuck unit 330 until the ring cover unit 201 is completely chucked to a chucking module 350 (see FIG. 15) of the vacuum chuck unit 330, the holding unit 240 maintains a state of being lowered by the lifting unit 230.

When the coupling of the ring cover unit 201 to the vacuum chuck unit 330 is completed, as the lifting unit 230 is driven, the holding unit 240 is moved upward to come into contact with a lower side of the tilting unit 220 or to be slightly spaced apart therefrom. When the holding unit 240 is completely moved upward, as the tilting motor unit 210 is driven, the tilting unit 220 and the holding unit 240 are rotated to enter a standby state in which the tilting unit 220 and the holding unit 240 are erected vertically or almost vertically.

In order to correct a coupling deviation of the holding unit 240 when the holding unit 240 couples the ring cover unit 201 to the vacuum chuck unit 330, position correction units 260 are installed at the lifting unit 230 and the holding unit 240 to be floatable. The coupling deviation refers to a deviation in which the locking pin 259 of the holding unit 240 is misaligned with the restraining groove 203 of the ring cover unit 201 when the holding unit 240 and the ring cover unit 201 are coupled.

The position correction unit 260 includes a thrust portion 261 and an elastic member 268.

A plurality of thrust portions 261 are connected to a lifting member 235 and a floating plate 243 such that the floating plate 243 floats by as much as a coupling deviation when the ring cover unit 201 is locked. The elastic member 268 is installed at a core member 241 and applies an elastic force to the floating plate 243 to return the floating plate 243 to the original position thereof when the ring cover unit 201 is unlocked.

When the holding unit 240 is lowered by the lifting unit 230 to couple the ring cover unit 201 to the vacuum chuck unit 330, the fixing hole 202 of the ring cover unit 201 may be slightly misaligned with the chuck pin 303 of the vacuum chuck unit 330 so that a coupling deviation may occur. In this case, the position correction unit 260 allows the holding unit 240 to float in a horizontal direction within a coupling deviation range.

As described above, since the tilting unit 220 and the holding unit 240 are rotated by the tilting motor unit 210, a rotation angle of the tilting motor unit 210 can be precisely controlled to precisely set a height (level) of the holding unit 240 and a sealing ring coupling position. In addition, the holding unit 240 and the tilting unit 220 are initially set at a coupling position of the ring cover unit 201. Accordingly, it is possible to considerably reduce a time for setting a holding position of the holding unit 240.

Since the tilting unit 220 is rotatably installed at the tilting motor unit 210, when a failure or power failure of the tilting motor unit 210 occurs, the tilting motor unit 210 maintains a current state without any change. Accordingly, it is possible to prevent the tilting unit 220 and the holding unit 240 from falling to collide with the vacuum chuck unit 330 in case of a failure or power failure.

In addition, since the holding unit 240 is installed to be floatable on the lifting unit 230 by the position correction unit 260, when the ring cover unit 201 is coupled to the vacuum chuck unit 330 in a state in which the holding unit 240 is slightly skewed, the position correction unit 260 is allowed to correct a coupling deviation of the holding unit 240. Therefore, it is possible to prevent abrasion due to a coupling deviation between the ring cover unit 201 and the chuck pin 303 of the vacuum chuck unit 330, thereby preventing foreign materials from being generated. In addition, foreign materials can be prevented from flowing into the wafer part 10 processed under the holding unit 240 and the ring cover unit 201, thereby minimizing the occurrence of contamination or defects of the wafer part 10.

Furthermore, since the tilting motor unit 210 tilts and rotates the tilting unit 220 and the holding unit 240, the number of installed driving elements can be reduced. Accordingly, it is possible to reduce manufacturing costs of an apparatus for processing the wafer part 10.

The lifting unit 230 includes a lifting driving part 231 and the lifting member 235.

The lifting driving part 231 is installed in the tilting unit 220. The lifting driving part 231 includes a lifting cylinder 232 and a lifting rod 233 installed in the lifting cylinder 232 to be lifted or lowered. The lifting member 235 is fixed to a lower side of the lifting rod 233. When a fluid flows into the lifting cylinder 232, the lifting rod 233 moves downward, and when a fluid flows out of the lifting cylinder 232, the lifting rod 233 moves upward.

The lifting member 235 is connected to the lifting driving part 231 and the holding unit 240 to be lifted or lowered by the lifting driving part 231, and the position correction unit 260 is installed such that the holding unit 240 floats. The lifting member 235 includes a lifting panel 236 installed apart from the holding unit 240. A coupling groove 237 is formed in a central portion of the lifting panel 236 such that the lifting rod 233 of the lifting driving part 231 is coupled thereto.

The holding unit 240 includes the core member 241, the floating plate 243, a plurality of cam link parts 251, a link driving part 255, and locking parts 256.

The core member 241 is disposed under w the lifting member 235. The core member 241 is spaced apart from a lower surface of the lifting member 235 and is disposed at a central portion of the lifting member 235. A plurality of core ribs (not shown) are formed to protrude in all directions from a circumferential portion of the core member 241. The core member 241 is installed to be rotatable at a certain angle in a circumferential direction of the floating plate 243.

The floating plate 243 is coupled to a lower side of the core member 241 and is connected to the position correction unit 260. The floating plate 243 is formed in a disk shape to face the vacuum chuck unit 330. The floating plate 243 is installed in contact with a lower side of the lifting member 235. A guide hole 246 is formed to pass through a circumferential portion of the floating plate 243 such that the locking part 256 moves linearly in a radial direction of the floating plate 243 when the cam link part 251 rotates.

The plurality of cam link parts 251 are connected to the core member 241 in all directions. Each of the cam link parts 251 is connected to the core member 241. The cam link parts 251 are fixed to the core member 241 through a plurality of coupling bolts (not shown). The cam link part 251 is formed in a linear panel shape.

The link driving part 255 is connected to the cam link part 251 and the floating plate 243 to move the cam link parts 251. One side of the link driving part 255 is fixed to the floating plate 243, and the other side of the link driving part 255 is connected to one cam link part 251. The link driving part 255 includes a link cylinder 255a and a link rod 255b movably installed in the link cylinder 255a. As a fluid flows into the link cylinder 255a, the link rod 255b is drawn out of the link cylinder 255a, and as a fluid is flows out of the link cylinder 255a, the link rod 255b enters the link cylinder 255a.

The locking part 256 is installed at each of the cam link parts 251 and locks and unlocks the ring cover unit 201 when the cam link parts 251 move. One locking part 256 is connected for each cam link part 251 at the circumferential portion of the floating plate 243.

When the link driving part 255 is driven, the core member 241 is rotated together with the plurality of cam link parts 251. That is, as the link driving part 255 is driven, one cam link unit 251 connected to the link driving part 255 is rotated at a certain angle around a center of the floating plate 243. Since the core member 241 rotates in the circumferential direction of the floating plate 243 as one cam link part 251 rotates at a certain angle, the plurality of cam link parts 251 rotate at the certain angle in the circumferential direction at the same time. As the plurality of cam link parts 251 rotate, the plurality of locking parts 256 concurrently lock and unlock the ring cover unit 201 to hold the ring cover unit 201. In this case, the floating plate 243 does not rotate.

The cam link part 251 includes cam rods 252 connected to the core member 241 in all directions and a cam 253 which is connected to the cam rod 252 and has a long hole 254 formed therein such that the locking part 256 is moved therein. In this case, the cam 253 is formed in a plate shape, and the long hole 254 is formed to be inclined with respect to a rotation radius of the cam 253. The link rod 255b of the link driving part 255 is connected to the cam rod 252. As the link driving part 255 is driven, the cam rod 252 and the cam 253 are rotated at a certain angle. As the cam 253 rotates, the locking part 256 may move along the long hole 254 to move linearly in the radial direction of the floating plate 243 so that the locking part 256 may move linearly to lock and unlock the ring cover unit 201.

The locking part 256 includes a slide portion 257 movably coupled to the long hole 254, a locking guide portion 258 connected to the slide portion 257 to move linearly when the slide portion 257 moves, and the locking pin 259 installed in the locking guide portion 258 to lock and unlock the ring cover unit 201 when the locking guide portion 258 moves. The slide portion 257 is a slide roller in rolling contact with the long hole 254. The locking guide portion 258 is installed in the guide hole 246 formed in the circumferential portion of the floating plate 243 to be linearly movable. The locking pin 259 extends to protrude from the inside of the locking guide portion 258. An end portion of the locking pin 259 is formed in any shape such as a conical shape or the like to be inserted into the restraining groove 203 of the ring cover unit 201.

The locking guide portion 258 includes a guide shaft 258a which is connected to the slide portion 257 and is movably installed in the guide hole 246 of the floating plate 243, a guide member 258b which is connected to the guide shaft 258a and in which the locking pin 259 is installed, and a plurality of guide rollers 258c which are installed to support both sides of the guide member 258b. The guide shaft 258a is axially coupled to the slide portion 257, the guide member 258b is formed in a rectangular plate shape, and two or more guide rollers 258c are disposed at both sides of the guide member 258b. An insertion groove (not shown) is formed in a circumferential portion of the guide roller 258c such that a side surface of the guide member 258b is inserted therein. As the link driving part 255 moves the cam link part 251, the slide portion 257 and the guide shaft 258a move linearly in a radial direction, and as the guide shaft 258a moves, the guide member 258b moves along the guide hole 246. In this case, the guide rollers 258c support the guide member 258b while rotating when the guide member 258b moves.

The long hole 254 of the locking part 256 is inclined with respect to the circumferential direction of the floating plate 243, the slide portion 257 is inserted into the long hole 254, and the guide shaft 258a is inserted into the guide hole 246 having a linear shape. Therefore, when the slide portion 257 and the guide shaft 258a are moved toward one end of the long hole 254 as the cam link part 251 is rotated to one side, the guide member 258b is moved toward a center of the floating plate 243, and the locking pin 259 is inserted into the restraining groove 203 of the ring cover unit 201 to lock (hold) the ring cover unit 201. In addition, when the slide portion 257 and the guide shaft 258a are moved toward the other end of the long hole 254 as the cam link part 251 is rotated to the other side, the guide member 258b is moved outside the floating plate 243, and the locking pin 259 is separated from the restraining groove 203 of the ring cover unit 201 to unlock (release) the ring cover unit 201.

The tilting device 200 further includes a docking part 270 which is movably installed at one side of the chuck table 320 and 330 to prevent the tilting device 200 from being lifted when the wafer part 10 is coupled and fixed to the chuck table 320 and 330. The docking part 270 is installed in a docking frame 271. The tilting device 200 includes an extension arm 224 extending from the tilting device 200 and a pressed portion 225 installed at an end portion of the extension arm 224. A lower side of the pressed portion 225 protrudes toward the docking part 270 to form a pressed rib.

Therefore, since the docking part 270 restrains the pressed portion 225 of the tilting device 200 to prevent the tilting device 200 from being lifted, a position of the wafer part 10 can be prevented from being changed when the holding unit 240 is lowered by the lifting unit 230 to couple the wafer part 10 to the chuck table 320 and 330. Furthermore, abrasion of the fixing hole 202 of the wafer part 10 and the chuck pin 303 can be prevented to prevent the generation of foreign materials.

The docking part 270 includes a docking driving part 173 installed in the docking frame 271 and a docking pressing part 175 moved by the docking driving part 173 to restrain the tilting device 200. The docking driving part 173 is installed to be movable in forward and backward directions and upward and downward directions so as to press the pressed portion 225 of the tilting unit downward after the tilting device 200 is completely lowered by the lifting unit 230. As long as the docking driving part 173 moves the docking pressing part 175 to restrain the tilting device 200, any form may be applied.

Figure 14:
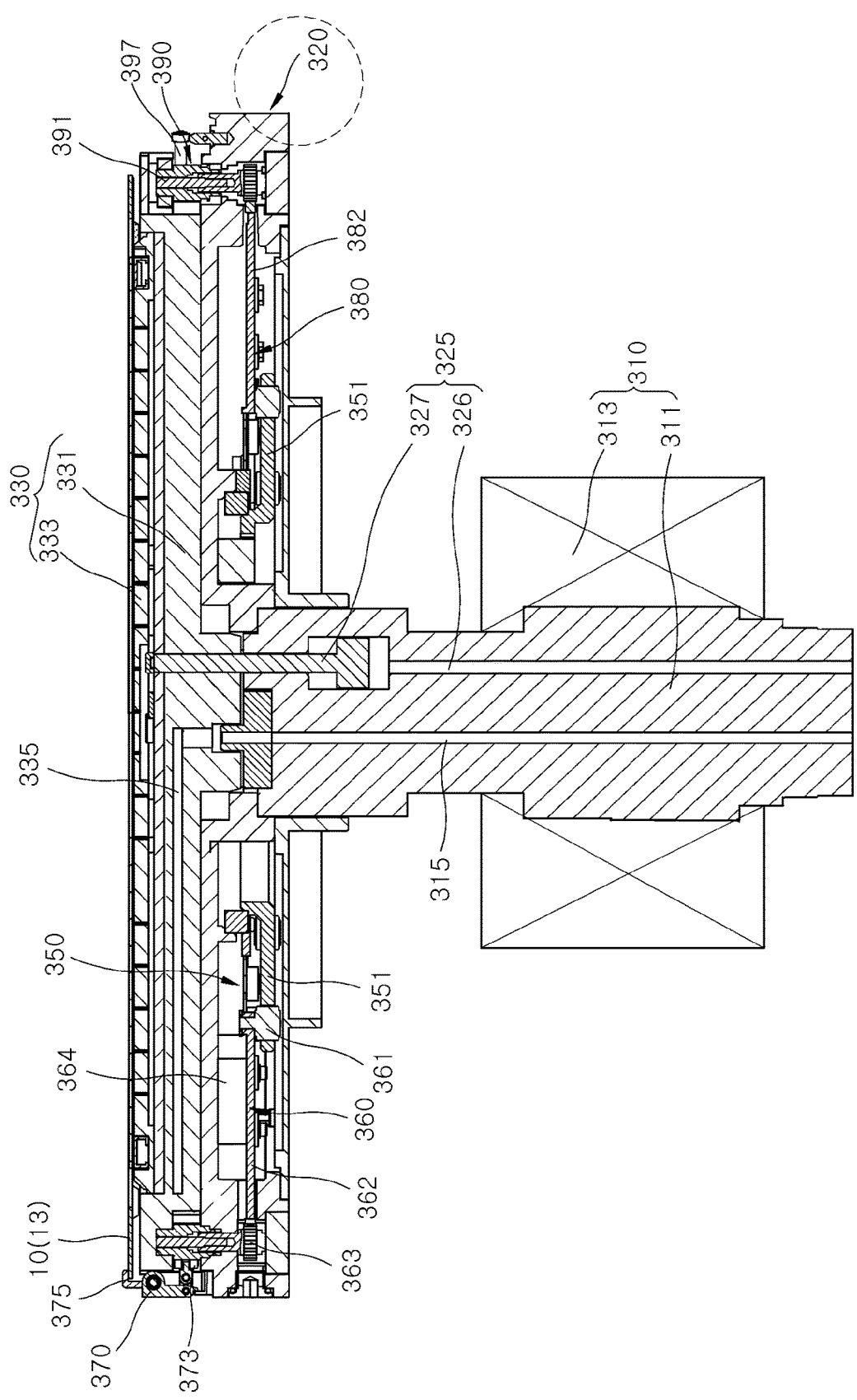
FIG. 14 is a schematic cross-sectional view illustrating a chuck table device in the wafer processing apparatus according to one embodiment of the present invention.
Figure 15:
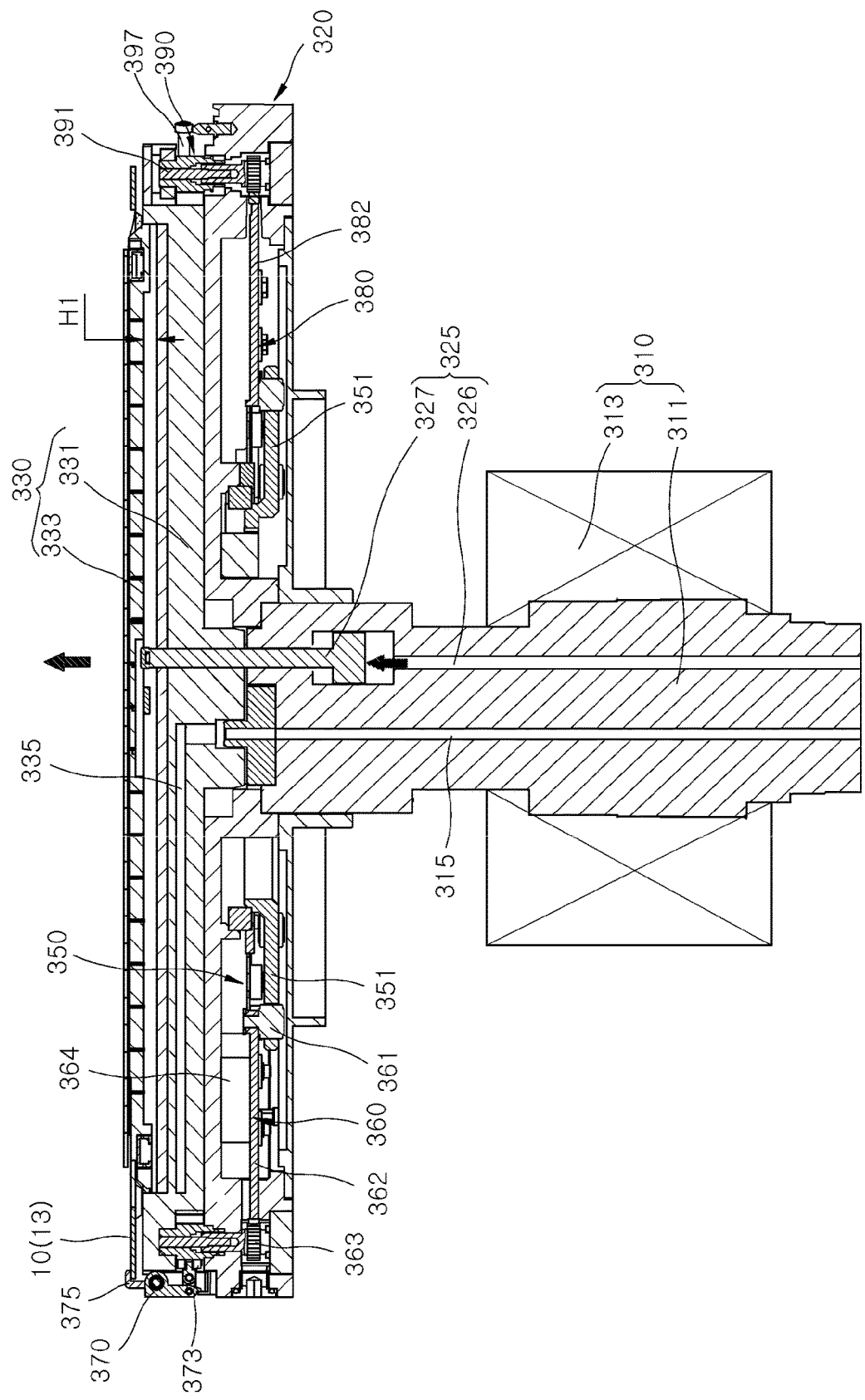
FIG. 15 is a schematic cross-sectional view illustrating a state in which a moving module moves a vacuum chuck unit in the chuck table device of the wafer processing apparatus according to one embodiment of the present invention.
Figure 16:
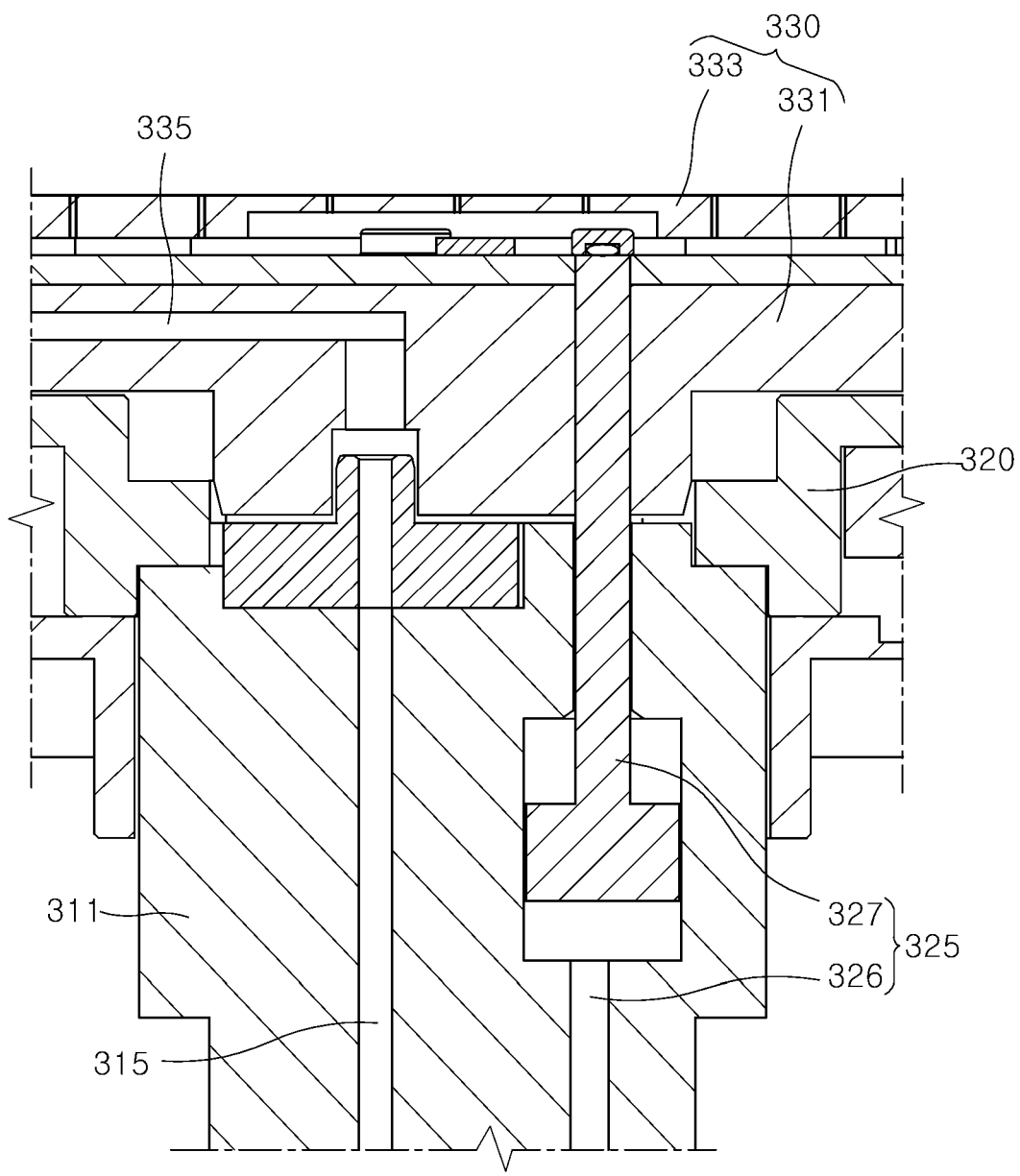
FIG. 16 is a schematic cross-sectional view illustrating the moving module in a chuck table of the wafer processing apparatus according to one embodiment of the present invention.
Figure 17A:
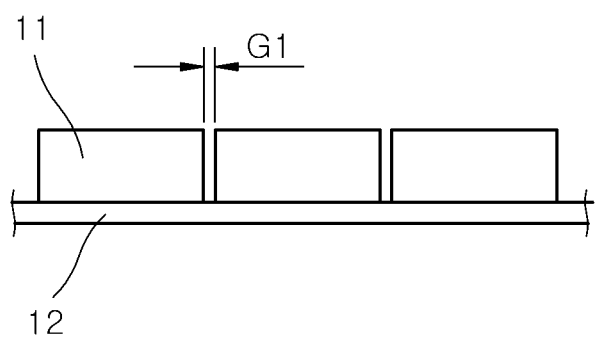
FIGS. 17A and 17B show schematic views illustrating a state in which the wafer part is stretched in a radial direction in the chuck table device of the wafer processing apparatus according to one embodiment of the present invention.
Figure 17B:
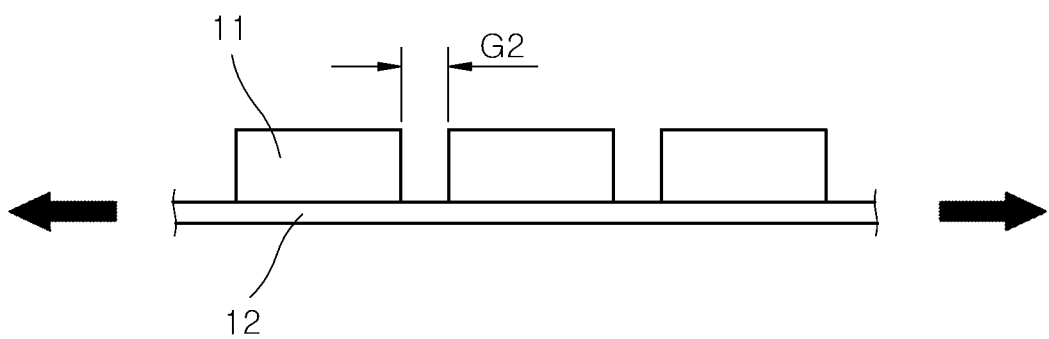
Figure 18:
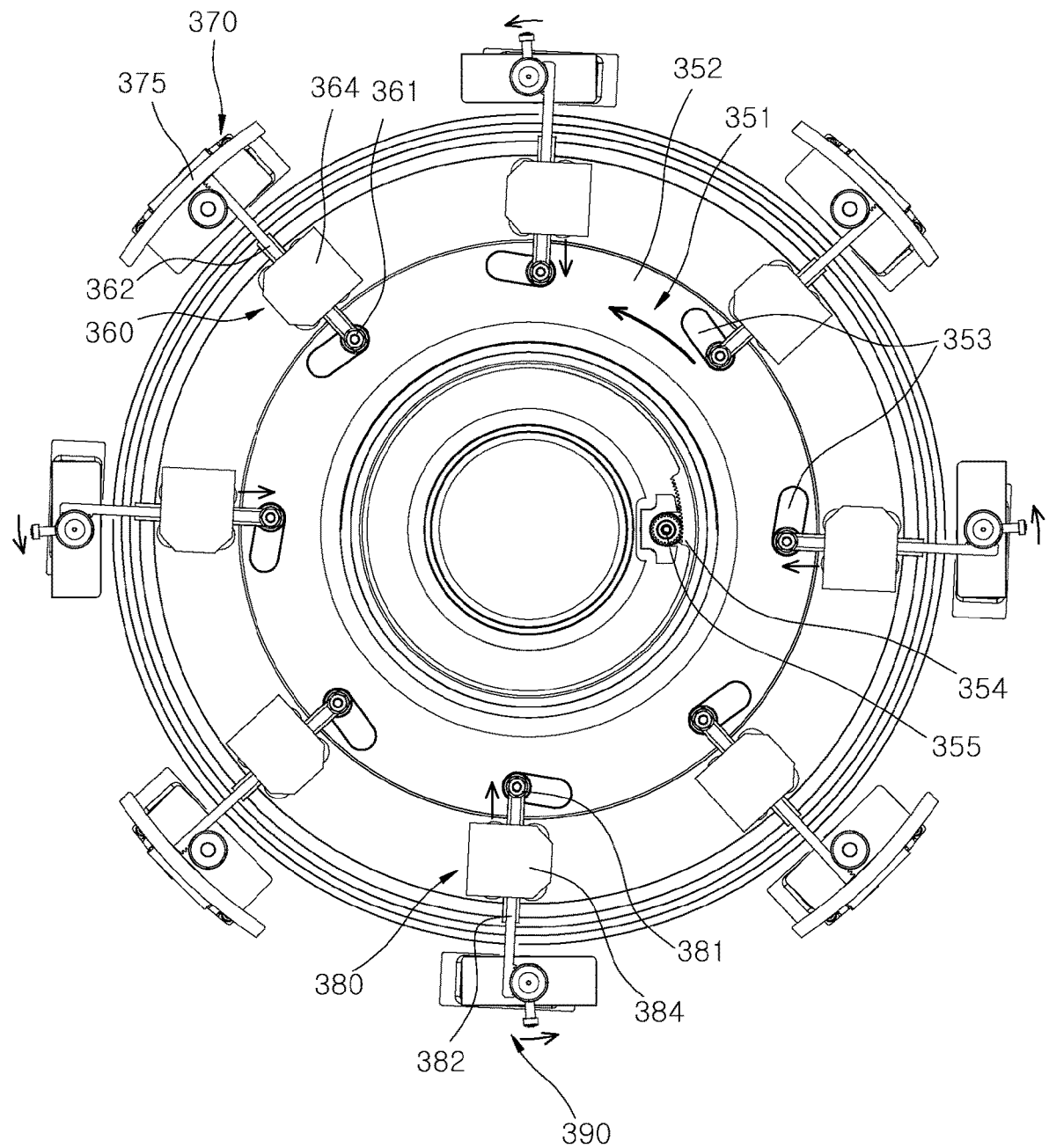
FIG. 18 is a schematic enlarged view illustrating a chucking module in the chuck table device of the wafer processing apparatus according to one embodiment of the present invention.
Figure 19:
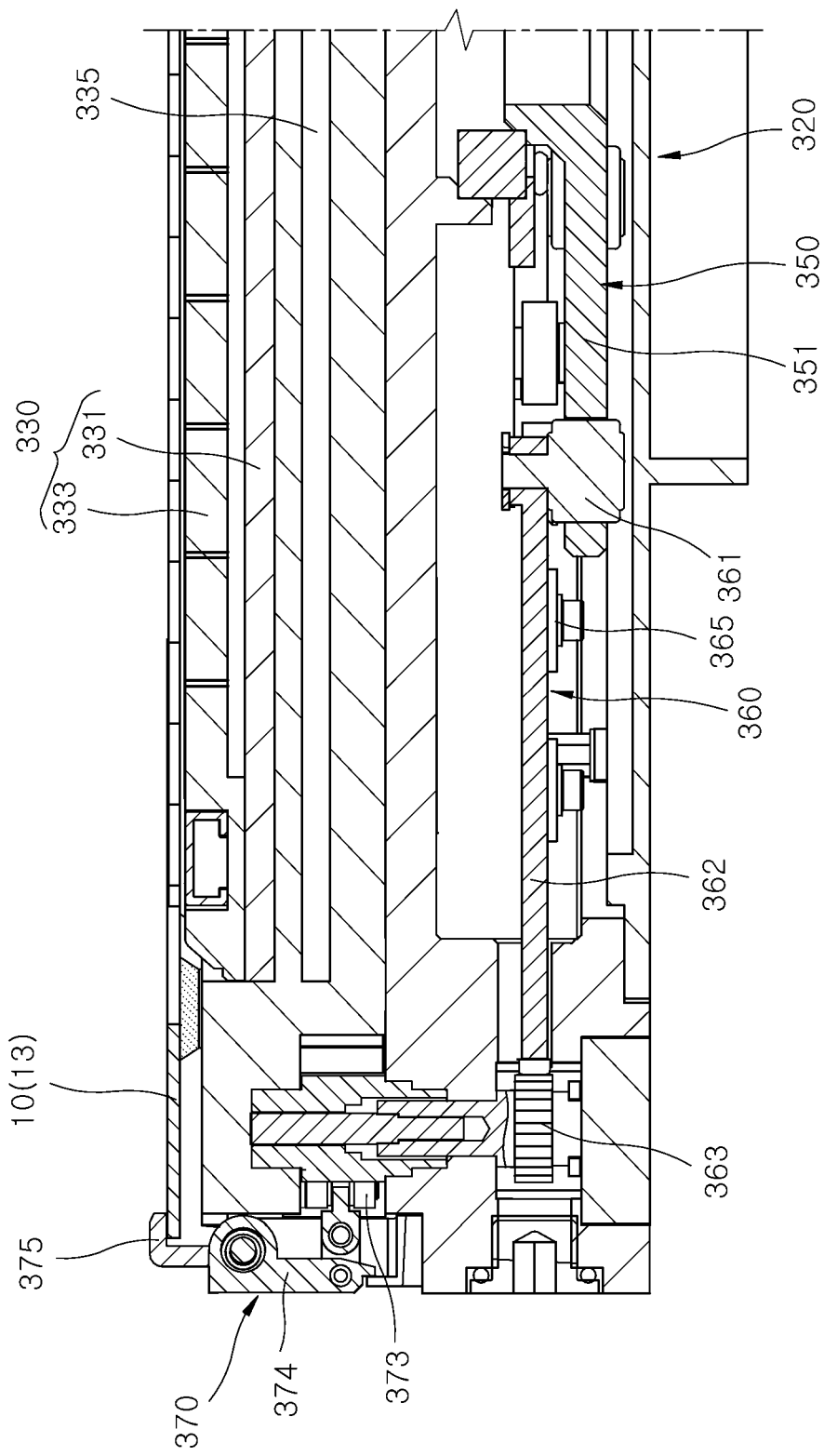
FIG. 19 is a schematic cross-sectional view illustrating a state in which a wafer restraining part of the chucking module restrains the wafer part in the chuck table device of the wafer processing apparatus according to one embodiment of the present invention.
Figure 20:
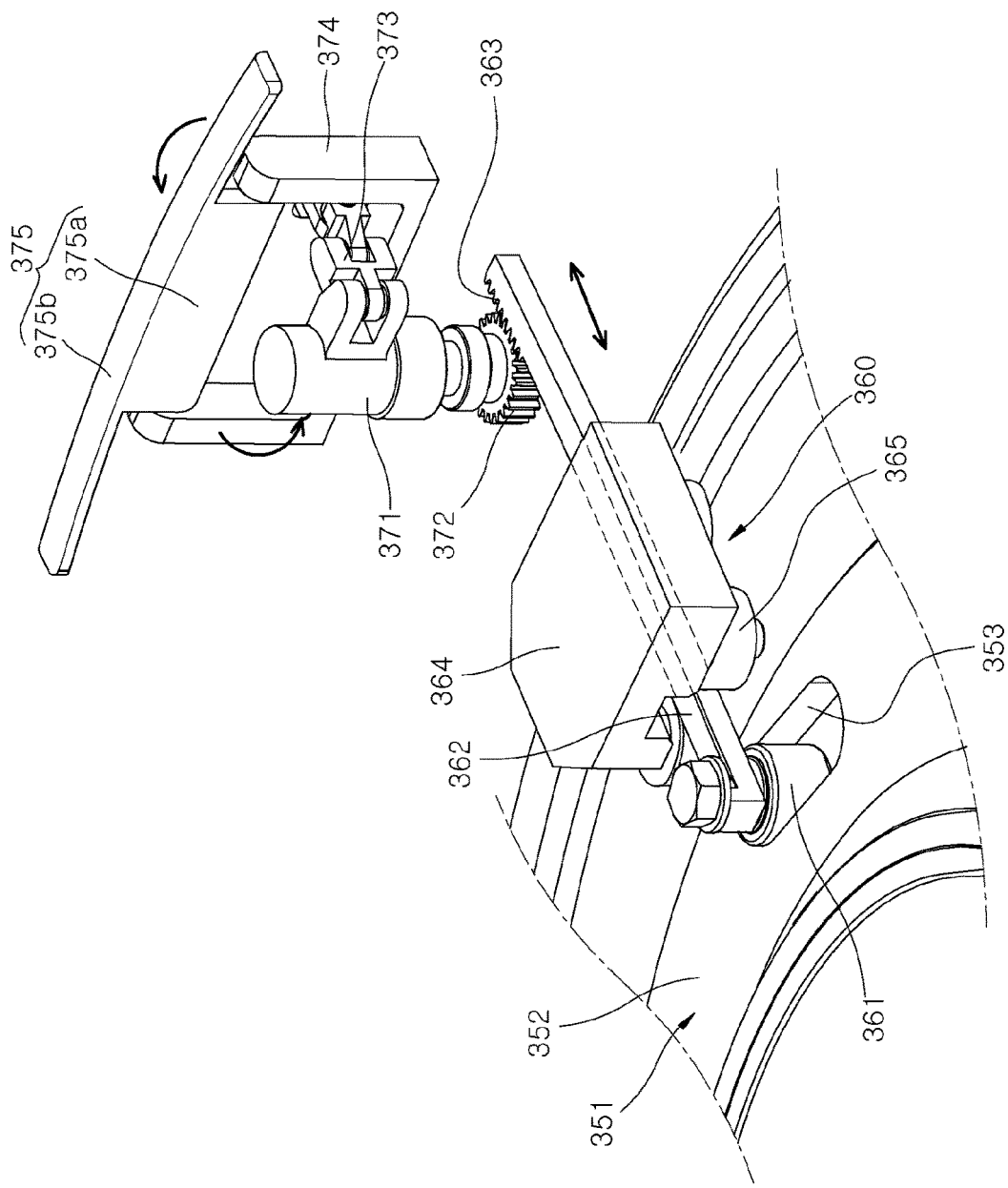
FIG. 20 is a schematic perspective view illustrating the wafer restraining part of the chucking module in the chuck table device of the wafer processing apparatus according to one embodiment of the present invention.

FIG. 14 is a schematic cross-sectional view illustrating the chuck table device in the wafer processing apparatus according to one embodiment of the present invention. FIG. 15 is a schematic cross-sectional view illustrating a state in which a moving module moves the vacuum chuck unit in the chuck table device of the wafer processing apparatus according to one embodiment of the present invention. FIG. 16 is a schematic cross-sectional view illustrating the moving module in the chuck table of the wafer processing apparatus according to one embodiment of the present invention. FIGS. 17A and 17B show schematic views illustrating a state in which the wafer part is stretched in a radial direction in the chuck table device of the wafer processing apparatus according to one embodiment of the present invention. FIG. 18 is a schematic enlarged view illustrating the chucking module in the chuck table device of the wafer processing apparatus according to one embodiment of the present invention. FIG. 19 is a schematic cross-sectional view illustrating a state in which a wafer restraining part of the chucking module restrains the wafer part in the chuck table device of the wafer processing apparatus according to one embodiment of the present invention. FIG. 20 is a schematic perspective view illustrating the wafer restraining part of the chucking module in the chuck table device of the wafer processing apparatus according to one embodiment of the present invention.

Referring to FIGS. 14 to 20, the chuck table device 300 includes the rotary chuck unit 320, the vacuum chuck unit 330, the chucking module 350, and a moving module 325.

The chuck driving unit 310 includes the rotating shaft 311 connected to a rotation center of the chuck table 320 and 330 and a chuck motor unit 313 installed on the rotating shaft 311. The chuck motor unit 313 includes a stator (not shown) installed inside a housing (not shown) and a rotor (not shown) disposed inside the stator and installed to surround the rotating shaft 311. In addition, as the chuck driving unit 310, a belt driving type for rotating the rotating shaft 311 through a belt or a chain driving type for rotating the rotating shaft 311 through a chain may be applied.

A vacuum flow path 315 is formed in the rotating shaft 311 to vacuumize the vacuum chuck unit 330. The vacuum flow path 315 is formed in a length direction of the rotating shaft 311. A vacuum chamber 335 is formed in the vacuum chuck unit 330 to be connected to the vacuum flow path 315.

The chuck table 320 and 330 includes a rotary chuck unit 320 and the vacuum chuck unit 330.

The rotary chuck unit 320 is rotatably installed on the chuck driving unit 310. The entirety of the rotary chuck unit 320 may be formed in a disk shape.

The vacuum chuck unit 330 is seated on the rotary chuck unit 320. The wafer part 10 is mounted on the vacuum chuck unit 330. The entirety of the vacuum chuck unit 330 is formed in a disk shape to be seated on the rotary chuck unit 320. When the chuck driving unit 310 is driven, the vacuum chuck unit 330 is rotated together with the rotary chuck unit 320.

In this case, when an etching process is performed, the wafer part 10 in a state in which the plurality of dies are not sawn is mounted on the vacuum chuck unit 330. When a cleaning process is performed, the wafer part 10 in which the plurality of dies are sawn is mounted on the vacuum chuck unit 330. When the dies are sawn in the wafer part 10, foreign materials may remain on surfaces of the dies and in gaps between the dies.

The moving module 325 is installed to move the vacuum chuck unit 330 or the chucking module 350 and widen the gaps between the dies in the wafer part 10. In a state in which the chucking module 350 fixes the retainer ring portion 13 of the wafer part 10 to the circumferential portion of the vacuum chuck unit 330, when the moving module 325 is moved, the wafer part 10 is pressed by the movement of the moving module 325. In this case, as the adhesive sheet 12 of the wafer part 10 is pulled in a radial direction thereof, the adhesive sheet 12 is stretched in the radial direction, and as the adhesive sheet 12 is stretched in the radial direction, gaps G2 between the plurality of dies widen. When a cleaning solution is sprayed onto the plurality of dies in a state where the gaps G2 between the plurality of dies widen, foreign materials attached to the surfaces of the dies as well as foreign materials positioned in the gaps between the plurality of dies can be easily removed by the cleaning solution. Accordingly, it is possible to considerably improve cleaning performance for removing foreign materials from the wafer part 10. In addition, cleaning performance for the wafer part 10 is considerably improved, thereby considerably reducing a defect rate of the wafer part 10.

The moving module 325 includes a medium flow path 326 and a moving rod 327. The medium flow path 326 is formed to supply a moving medium to the chuck driving unit 310. The medium flow path 326 may be formed inside the rotating shaft 311 in a length direction of the rotating shaft 311. The moving medium may be air or gas. The moving rod 327 is elevated by pressure of the moving medium and is installed in contact with a lower portion of the vacuum chuck unit 330. A restoration spring may be installed in the moving rod 327 to restore the moving medium to the original position thereof when the pressure of the moving medium is released. A plurality of moving rods 327 and a plurality of medium flow paths 326 may be installed in a circumferential direction of the rotating shaft 311. When the plurality of moving rods 327 vertically moves the vacuum chuck unit 330, the vacuum chuck unit 330 may be vertically moved while maintaining a horizontal state.

Of course, in addition to the moving rod 327, a cylinder or a solenoid may be applied to the moving module 325.

The vacuum chuck unit 330 includes a first vacuum chuck 331 and a second vacuum chuck 333. The first vacuum chuck 331 is installed in the rotary chuck unit 320 to rotate together with the rotary chuck unit 320, and the vacuum chamber 335 is formed therein. The first vacuum chuck 331 forms a vacuum to adsorb the wafer part 10. The second vacuum chuck 333 is mounted on the first vacuum chuck 331, and the ring cover unit 201 is installed. The second vacuum chuck 333 is installed to be moved by a moving module (not shown).

A plurality of adsorption holes (not shown) communicating with the vacuum chamber 335 of the first vacuum chuck 331 are formed in the second vacuum chuck 333 to adsorb the wafer part 10. The plurality of adsorption holes may be arranged in a concentric circle shape in a circumferential direction of the second vacuum chuck 333. When a vacuum is formed in the vacuum chamber 335, the wafer part 10 may be closely pressed against an upper surface of the second vacuum chuck 333 by a vacuum suction force of the adsorption holes.

The chuck table device 300 further includes the chucking module 350 which is installed in the rotary chuck unit 320, fixes the wafer part 10 to the vacuum chuck unit 330, and fixes the ring cover unit 201 to the rotary chuck unit 320.

The chucking module 350 includes a chucking base 351, a chucking rotating part 355, a plurality of first chucking link parts 360, a plurality of wafer restraining parts 370, a plurality of second chucking link parts 380, and a plurality of cover restraining parts 390.

The chucking base 351 is installed in the rotary chuck unit 320. The chucking rotating part 355 is connected to the chucking base 351 to rotate the chucking base 351. The plurality of first chucking link parts 360 are each connected to the chucking base 351, extend in all directions, and move when the chucking base 351 rotates. Each of the plurality of wafer restraining parts 370 is connected to one of the first chucking link parts 360 to fix the retainer ring portion 13 of the wafer part 10 when the first chucking link parts 360 move. The chucking base 351 is installed to be concentric with the rotary chuck unit 320. The chucking base 351, the chucking rotating part 355, and the first chucking link part 360 are disposed inside the rotary chuck unit 320, and the wafer restraining part 370 is disposed around the rotary chuck unit 320 and the vacuum chuck unit 330.

When the chucking rotating part 355 is driven, as the chucking base 351 is rotated at a certain angle, the plurality of first chucking link parts 360 are moved in a radial direction of the chucking base 351. As the plurality of first chucking link parts 360 move simultaneously, the plurality of wafer restraining parts 370 press and fix the retainer ring portion 13 of the wafer part 10 to a circumferential portion of the first vacuum chuck 331.

The chucking base 351 includes a base body 352, a plurality of guide portions 353, and a base gear portion 354.

The base body 352 is formed in an annular shape to be concentric with the rotating shaft 311 of the rotary chuck unit 320. The base body 352 is installed inside the rotary chuck unit 320. The plurality of guide portions 353 are formed in the base body 352 such that the first chucking link parts 360 are movably coupled thereto. The number of the plurality of guide portions 353 is twice the number of the first chucking link parts 360, and the plurality of guide portions 353 are formed at equal intervals in a circumferential direction of the base body 352. The first chucking link parts 360 are coupled to every other guide portion 353 among the plurality of guide portions 353. The base gear portion 354 is formed in the base body 352 and is connected to the chucking rotating part 355. The base gear portion 354 is disposed in an arc shape on an inner circumferential surface of the base body 352. As the chucking rotating part 355 is driven, the base gear portion 354 is rotated, and as the base body 352 is rotated together with the base gear portion 354, the first chucking link parts 360 are moved in a radial direction of the base body 352.

The guide portion 353 is formed to be inclined with respect to the radial direction of the base body 352. The guide portion 353 may be a guide hole. The guide portion 353 may be a guide groove or a guide protrusion. Since the guide portion 353 is formed to be inclined with respect to the radial direction of the base body 352, as the base body 352 rotates at a certain angle, the first chucking link parts 360 move linearly in the radial direction of the base body 352.

The first chucking link parts 360 each include a first guide slider 361, a first link member 362, and a first link gear portion 363. The first guide slider 361 is movably coupled to the guide portion 353. The first link member 362 is connected to the first guide slider 361 and moves linearly in the radial direction of the base body 352 when the first guide slider 361 moves. The first link member 362 is formed in a straight bar shape. The first link gear portion 363 is formed in the first link member 362 to move while engaged with the wafer restraining part 370. The first link gear portion 363 is formed in the form of a rack gear parallel to a length direction of the first link member 362.

The first chucking link parts 360 each further include a first guide block 364 to which the first link member 362 is coupled to be linearly movable. The first guide block 364 prevents the first link member 362 from rotating in the circumferential direction of the base body 352 when the base body 352 rotates. Accordingly, when the first guide slider 361 moves along the guide portion 353 when the base body 352 rotates, the first link member 362 may move linearly without rotating.

The wafer restraining parts 370 each include a pressing gripper 375 which rotates to press and release the retainer ring portion 13 of the wafer part 10 when a gripper link portion 373 moves. The pressing gripper 375 is formed in an arc shape to press and fix the retainer ring portion 13 of the wafer part 10 in a circumferential direction.

The pressing gripper 375 includes a gripper turning portion 375a which is hinge-coupled to a gripper supporter portion 374 and is connected to the gripper link portion 373 and a pressing finger 375b which is formed at the gripper turning portion 375a to press and release the retainer ring portion 13 of the wafer part 10. When the gripper gear portion 372 rotates while engaged with the first link gear portion 363 when the first chucking link part 360 linearly moves, the gripper turning portion 375a rotates on the gripper supporter portion 374. As the gripper turning portion 375a turns, the pressing finger 375b presses and releases the retainer ring portion 13 of the wafer part 10.

The plurality of second chucking link parts 380 are connected to the chucking base 351 in all directions and move when the chucking base 351 rotates. The plurality of cover restraining parts 390 are connected to the second chucking link parts 380 to fix the ring cover unit 201 to the rotary chuck unit 320 when the second chucking link parts 380 move. As the chucking rotating part 355 is driven, the base gear portion 354 is rotated, and as the base body 352 is rotated together with the base gear portion 354, the second chucking link parts 380 are moved in the radial direction of the base body 352. In this case, when the base body 352 of the chucking base 351 rotates, the plurality of first chucking link parts 360 and the plurality of second chucking link parts 380 simultaneously move. As the first chucking link parts 360 move, the retainer ring portion 13 of the wafer part 10 is fixed to the vacuum chuck unit 330, and as the second chucking link parts 380 move, the ring cover unit 201 is fixed to the rotary chuck unit 320. Accordingly, since the wafer part 10 and the ring cover unit 201 are simultaneously fixed to the vacuum chuck unit 330 and the rotary chuck unit 320 using one chucking base 351 and one chucking rotating part 355, the structure of the chuck table device 300 can be simplified.

The second chucking link parts 380 each include a second guide slider 381 and a second link member 382.

The second guide slider 381 is movably coupled to the guide portion 353. The second link member 382 is connected to the second guide slider 381 and moves linearly in the radial direction of the base body 352 when the second guide slider 381 moves. A second link gear portion 383 is formed in the second link member 382 to move while engaged with the wafer restraining part 390. The second link member 382 is formed in a straight bar shape. The second link gear portion 383 is formed in the form of a rack gear parallel to a length direction of the second link member 382.

The second chucking link part 380 further includes a second guide block 384 to which the second link member 382 is coupled to be linearly movable. The second guide block 384 prevents the second chucking link part 380 from rotating in the circumferential direction of the base body 352 when the base body 352 rotates. Accordingly, when the second guide slider 381 moves along the guide portion 353 while the base body 352 rotates, the second link member 382 may move linearly without rotating.

The cover restraining parts 390 are connected to the second chucking link parts 380 to fix a restraining stepped portion (not shown) of the ring cover unit 201 to the rotary chuck unit 320 when the second chucking link parts 380 move.

As described above, the chuck table device 300 includes the wafer restraining parts 370 which restrain the retainer ring portion 13 of the wafer part 10, the cover restraining parts 390 which restrain the ring cover unit 201, and the moving module 325 which moves the vacuum chuck unit 330 to pull the wafer part 10 in a radial direction thereof. Accordingly, in a state in which the wafer restraining parts 370 restrain the retainer ring portion 13 of the wafer part 10 to the vacuum chuck unit 330 and the vacuum chuck unit 330 is moved to widen the gaps between the dies of the wafer part 10, a wafer expanding process of processing the wafer part 10 is possible. In addition, in a state in which the cover restraining parts 390 restrain the ring cover unit 201 to an upper side of the vacuum chuck unit 330, a debonding cleaning process of processing the wafer part 10 is possible.

Figure 21:
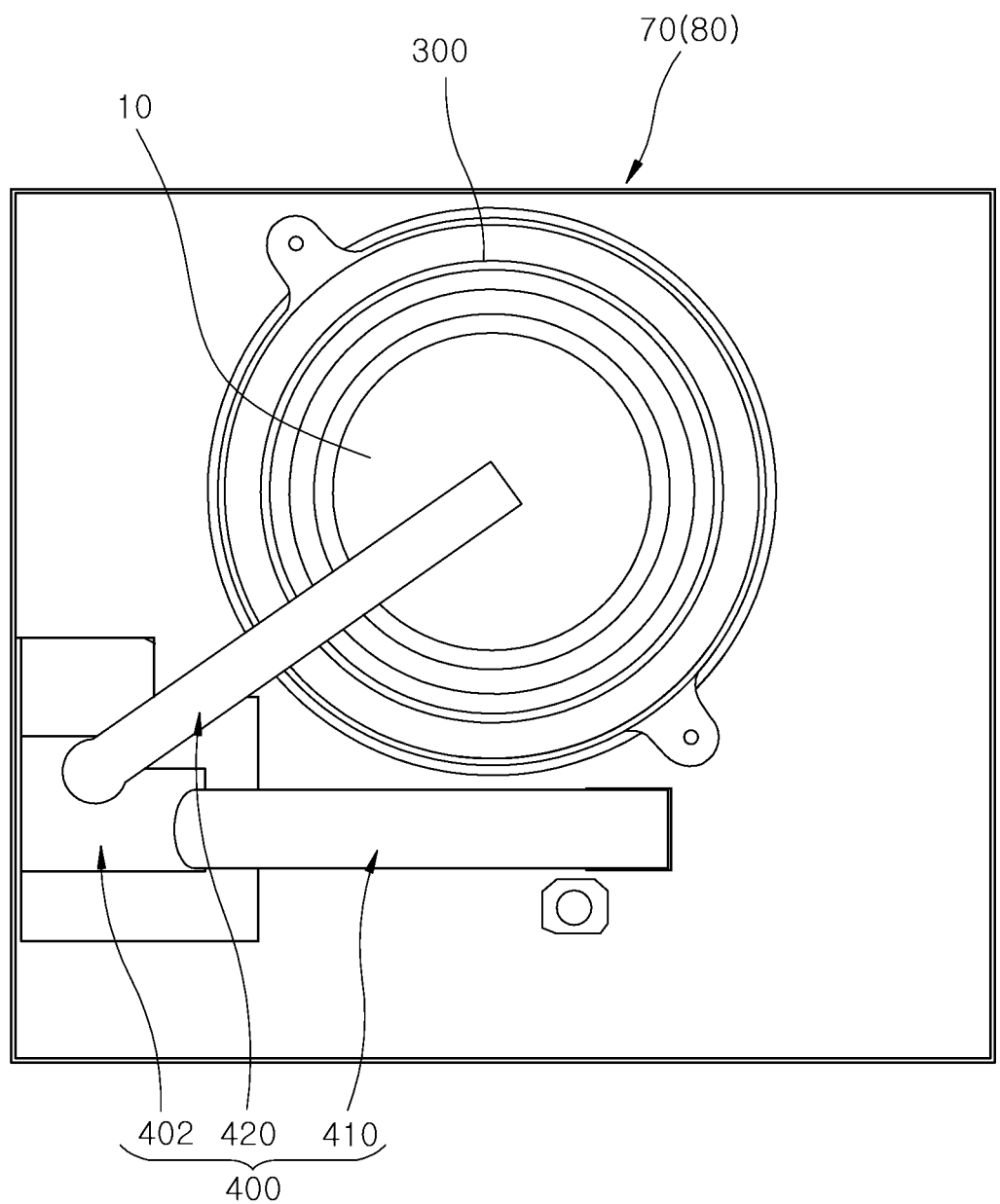
FIG. 21 is a schematic plan view illustrating a processing solution spray device of the wafer processing apparatus according to one embodiment of the present invention.
Figure 22:
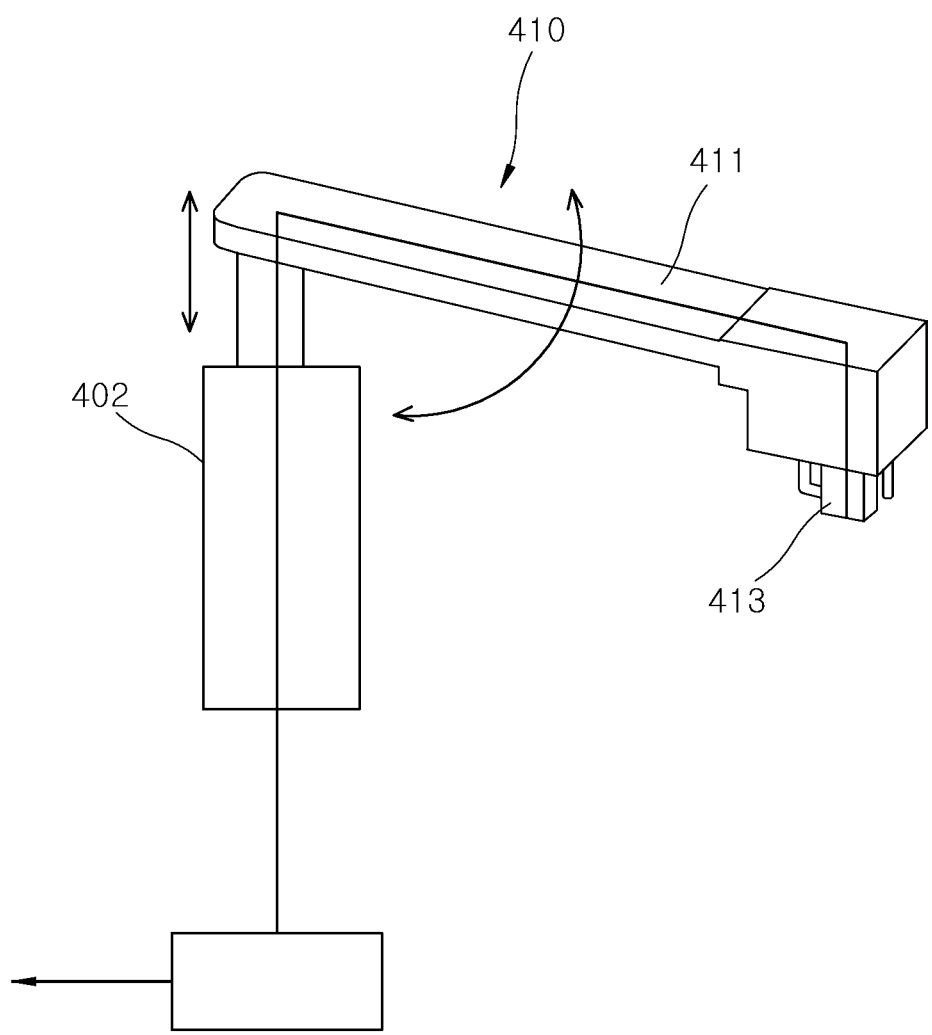
FIG. 22 is a schematic perspective view illustrating a spray arm module in the processing solution spray device of the wafer processing apparatus according to one embodiment of the present invention.
Figure 23:
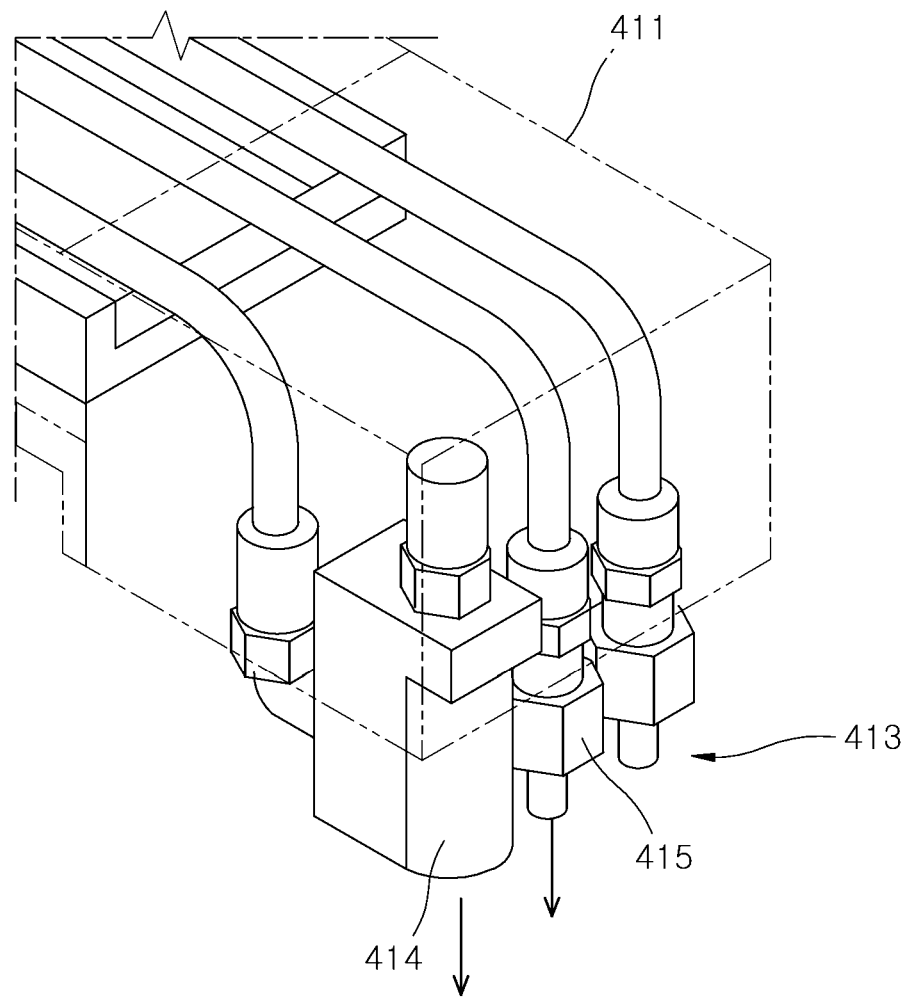
FIG. 23 is a schematic enlarged view illustrating a first spray nozzle unit of the spray arm module in the processing solution spray device of the wafer processing apparatus according to one embodiment of the present invention.
Figure 24:
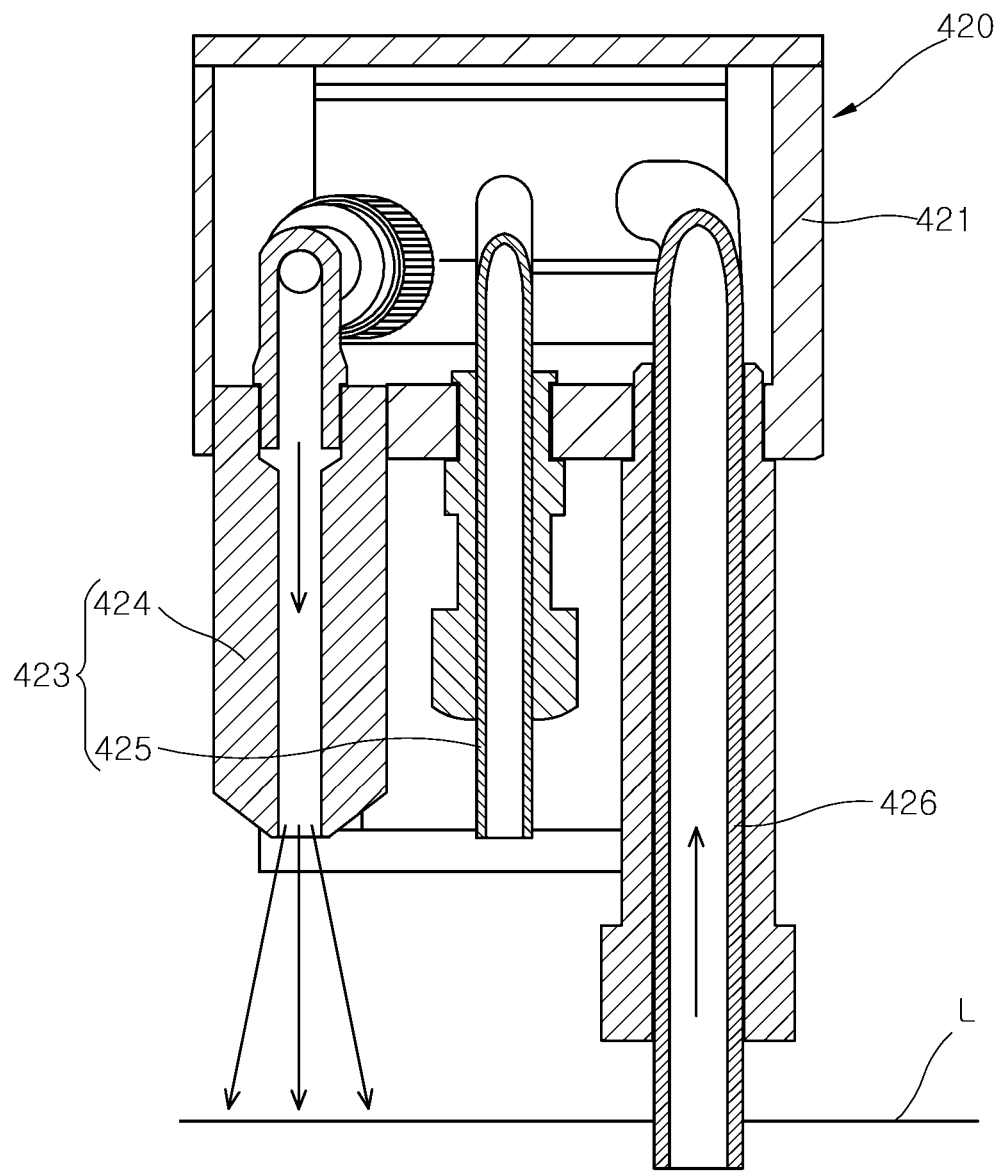
FIG. 24 is a schematic enlarged view illustrating a second spray nozzle unit and a second suction nozzle unit of a spray suction arm module in the processing solution spray device of the wafer processing apparatus according to one embodiment of the present invention.

FIG. 21 is a schematic plan view illustrating a processing solution spray device of the wafer processing apparatus according to one embodiment of the present invention. FIG. 22 is a schematic perspective view illustrating a spray arm module in the processing solution spray device of the wafer processing apparatus according to one embodiment of the present invention. FIG. 23 is a schematic enlarged view illustrating a first spray nozzle unit of the spray arm module in the processing solution spray device of the wafer processing apparatus according to one embodiment of the present invention. FIG. 24 is a schematic enlarged view illustrating a second spray nozzle unit and a second suction nozzle unit of a spray suction arm module in the processing solution spray device of the wafer processing apparatus according to one embodiment of the present invention.

Referring to FIGS. 21 to 24, a processing solution spray device 400 is installed outside the chuck table device 300. The processing solution spray device 400 includes an arm driving unit 402, a spray arm module 410, and a spray suction arm module 420.

The spray arm module 410 is connected to the arm driving unit 402. The spray arm module 410 is moved upward or downward with respect to the chuck table device 300 by the arm driving unit 402 and is installed to be rotatable from the outside to the inside of the chuck table device 300.

The spray arm module 410 includes a first spray arm 411 and a first spray nozzle unit 413. The first spray arm 411 is disposed above the wafer part 10 by about half of the wafer part 10 in a radial direction. The first spray nozzle unit includes one or more first spray nozzles 414 and 415 connected to a plurality of processing solution supply pipes (not shown). The first spray nozzles 414 and 415 may chemically process the wafer part 10 by spraying cleaning solutions such as a plurality of chemical substances.

The number of the first spray nozzles 414 and 415 may be variously changed according to a shape of the processing solution spray device 400 or a processing method of the wafer part 10. The processing method of the wafer part 10 includes an etching method or cleaning method of the wafer part 10.

The spray suction arm module 420 is connected to the arm driving unit 402. The spray suction arm module 420 is moved upward or downward with respect to the chuck table device 300 by the arm driving unit 402 and is installed to be rotatable from the outside to the inside of the chuck table device 300.

The spray suction arm module 420 includes a second spray arm 421, a second spray nozzle unit 423, and a second suction nozzle unit 426. The second spray arm 421 is disposed above the wafer part 10 by about half of the wafer part 10 in the radial direction. The second spray nozzle unit 423 includes a second spray nozzle 424 and a third spray nozzle 425. The second suction nozzle unit 426 is immersed in a processing solution to suction the processing solution and sludge accommodated in the chuck table device 300. In addition, the second spray nozzle unit 423 is disposed at a certain height from the processing solution to spray the processing solution onto the wafer part 10 mounted on the chuck table device 300. The second spray nozzle 424 sprays a cleaning solution, in which pure water and nitrogen are mixed, onto the wafer part 10. The third spray nozzle 425 sprays a processing solution such as a thinner onto the wafer part 10. When the wafer part 10 is processed by spraying a processing solution from one of the second spray nozzle 424 and the third spray nozzle 425, the second suction nozzle unit 426 suctions sludge floating in the processing solution.

Figure 25:
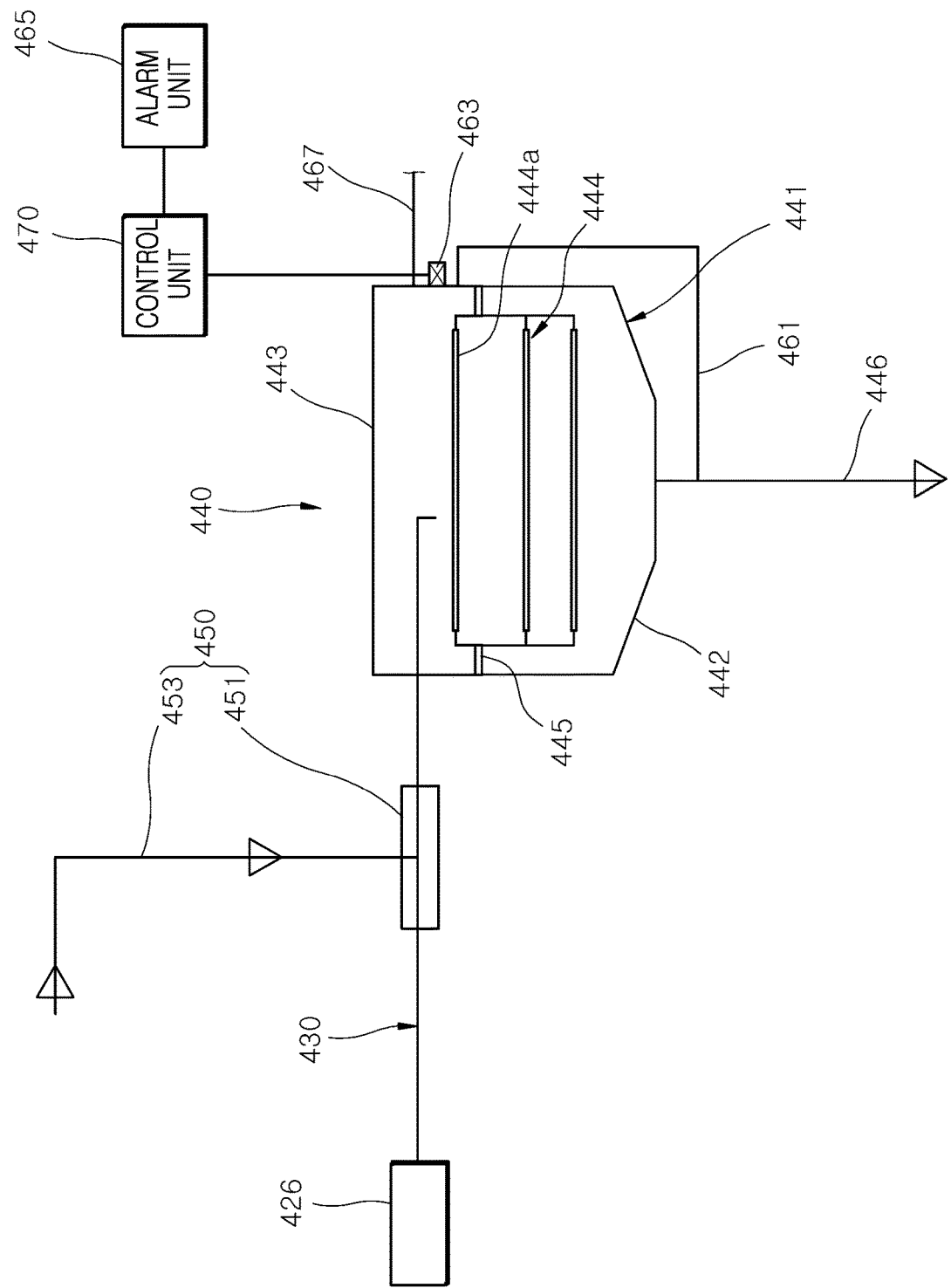
FIG. 25 is a schematic view illustrating a suction tank connected to the second suction nozzle unit of the spray suction arm module in the processing solution spray device of the wafer processing apparatus according to one embodiment of the present invention.

FIG. 25 is a schematic view illustrating a suction tank connected to the second suction nozzle unit of the spray suction arm module in the processing solution spray device of the wafer processing apparatus according to one embodiment of the present invention.

Referring to FIG. 25, sludge suctioned by the second suction nozzle unit 426 of the spray suction arm module 420 is discharged to a suction tank 440 through a flow line 430.

The flow line 430 is connected to the second suction nozzle unit 426 such that sludge and a processing solution flow therein. When suction pressure is generated in the flow line 430, the second suction nozzle unit 426 suctions sludge floating at an upper side of the processing solution. The sludge and the processing solution suctioned into the second suction nozzle unit 426 flow in the flow line 430.

The suction tank 440 is connected to the flow line 430 such that the sludge and the processing solution flow thereto. Negative pressure lower than atmospheric pressure is formed inside the suction tank 440 to suction the sludge and the processing solution.

An ejector 450 is installed on the flow line 430 to form suction pressure in the second suction nozzle unit 426 and the flow line 430. Since the ejector 450 is installed on the flow line 430, the second suction nozzle unit 426 may be expanded more as compared with a structure in which the ejector 450 is installed on the second suction nozzle unit 426. In addition, the size of the ejector 450 may be increased. Accordingly, it is possible to prevent the second suction nozzle unit 426 and the ejector 450 from being clogged by sludge After a process of processing the wafer part 10 is ended, the ejector 450 may be driven for a preset time. For example, after the process of processing the wafer part 10 is ended, the ejector 450 is driven for about 3 to 5 minutes. Therefore, since sludge and a processing solution remaining in the second suction nozzle unit 426 and the flow line 430 are completely discharged to the suction tank 440, the wafer part 10 can be prevented from being contaminated due to the processing solution falling from the second suction nozzle unit 426.

The ejector 450 includes an ejector body 451 and a gas supply unit 453. Sludge and a processing solution suctioned into the flow line 430 flow into the ejector body 451. The gas supply unit 453 is connected to the ejector body 451 to supply a gas to the ejector body 451. As the gas, hydrogen gas, which is explosive but prevents a chemical bond to a processing solution, is provided. Since the gas supply unit 453 supplies the gas to the ejector body 451, suction pressure lower than atmospheric pressure is generated inside the ejector body 451. In addition, since the gas of the ejector body 451 flows into the suction tank 440 and then is discharged, negative pressure is generated in the suction tank 440.

The suction tank 440 includes a suction tank body 441, a filter unit 444, and a drain unit 446.

The suction tank body 441 is connected to the flow line 430. A processing solution, sludge, and a gas flowing in the flow line 430 flow into the suction tank body 441. As a gas is discharged through a discharge line 467, negative pressure lower than atmospheric pressure is formed in the suction tank body 441. A bottom surface of the suction tank body 441 is inclined toward a center thereof such that a processing solution is collected.

A window 443 is installed on the suction tank body 441 so that the inside of the suction tank is visible from the outside. Accordingly, an operator can check an internal state of the suction tank body 441 by looking through the window 443.

The filter unit 444 is disposed inside the suction tank body 441 to filter sludge discharged from the flow line 430. The filter unit 444 is supported by a support 445.

The filter unit 444 includes a plurality of filters 444a stacked between the flow line 430 and the drain unit 446, and the plurality of filters 444a have meshes which become smaller toward the drain unit 446. Accordingly, sludge with large particles is filtered by the filter 444a at an upper side, and sludge with small particles is filtered by the filter 444a at a lower side. The plurality of filters 444a are detachably installed at the support 445. Therefore, when the filter 444a is clogged, after the filter 444a is separated from the support 445, the filter 144a may be cleaned and installed at the support 445 again.

The drain unit 446 is connected to the suction tank body 441 to discharge a processing solution filtered by the filter unit 444. The drain unit 446 is connected to the lowest portion of a bottom surface 442 of the suction tank body 441. The drain unit 446 may be connected to a processing solution collection unit (not shown) or the chuck table device 300. Since the drain unit 446 is connected to the lowest portion of the bottom surface 442 of the suction tank body 441, it is possible to prevent a processing solution from remaining inside the suction tank body 441.

The wafer processing apparatus 1 further includes an overflow line 461 connected to the suction tank body 441 and the drain unit 446. The overflow line 461 is connected to a portion above the filter unit 444 in the suction tank 440. When the filter unit 444 is clogged by sludge, a processing solution may overflow to an upper side of the suction tank body 441. In this case, the overflowing processing solution is discharged to the drain unit 446 through the overflow line 461.

The wafer processing apparatus 1 further includes an overflow detection unit 463 which detects that a processing solution of the suction tank body 441 flows into the overflow line 461. The overflow detection unit 463 may be a water level sensor for detecting a level of a processing solution. When the overflow detection unit 463 detects that the processing solution overflows, the overflow detection unit 463 transmits a signal to a control unit 470. The control unit 470 controls an alarm unit 465 to generate an alarm and controls the second spray nozzle unit 423 to stop the supply of the processing solution. The operator opens the suction tank body 441 to replace or clean the filter unit 444.

The wafer processing apparatus 1 further includes a discharge line 467 connected to the suction tank 440 to discharge a processing solution fume and a gas inside the suction tank 440. The discharge line 467 may be connected to a collection device (not shown). When a processing solution evaporates, a processing solution fume is generated, and the processing solution fume and a gas are discharged through the discharge line 467 so that negative pressure is formed inside the suction tank 440. Accordingly, a processing solution, sludge, and a gas of the flow line 430 are suctioned into the suction tank 440.

A wafer processing method of the wafer processing apparatus according to one embodiment of the present invention configured as described above will be described.

Figure 26A:
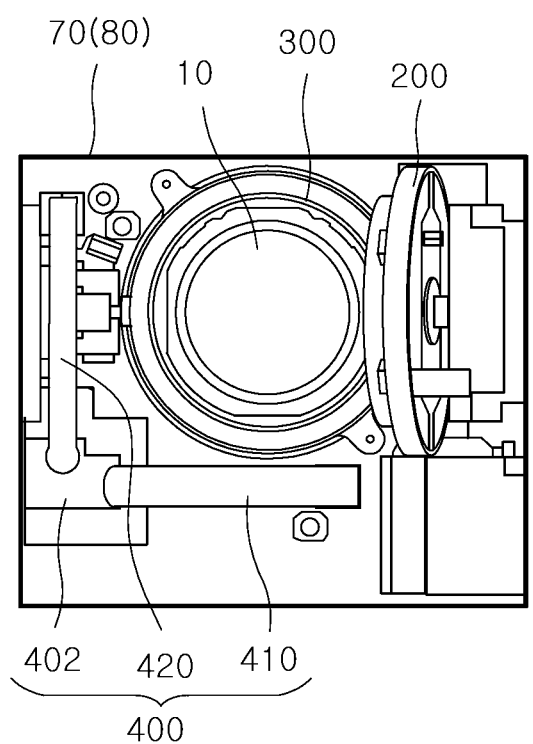
FIGS. 26A to 26D show schematic views illustrating a wafer processing method according to one embodiment of the present invention.
Figure 26B:
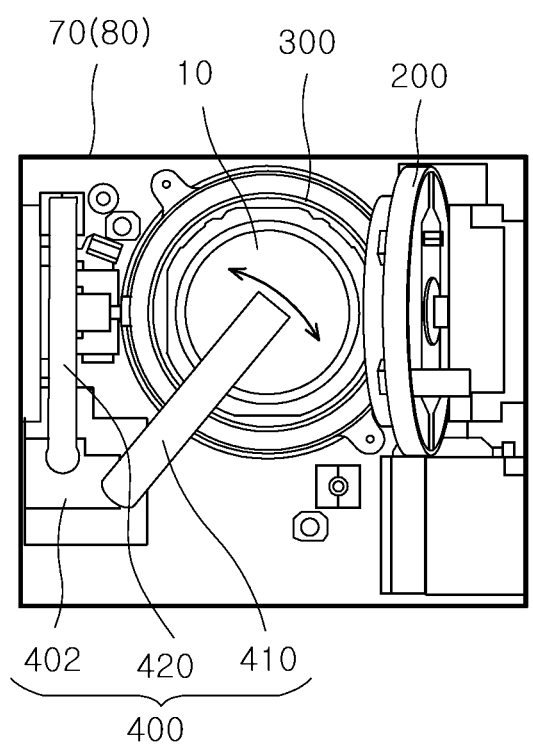
Figure 26C:
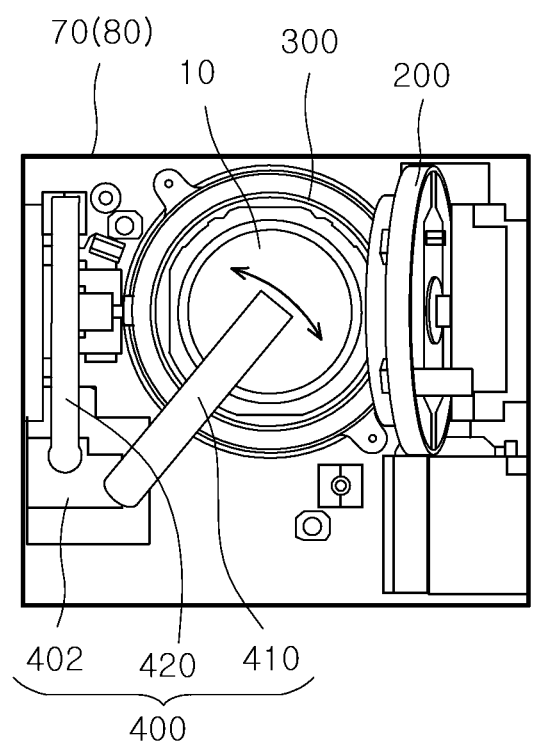
Figure 26D:
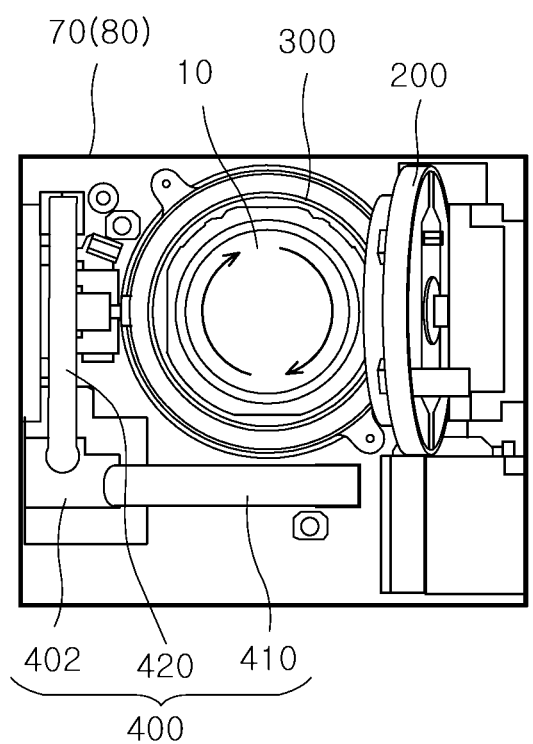
Figure 27:
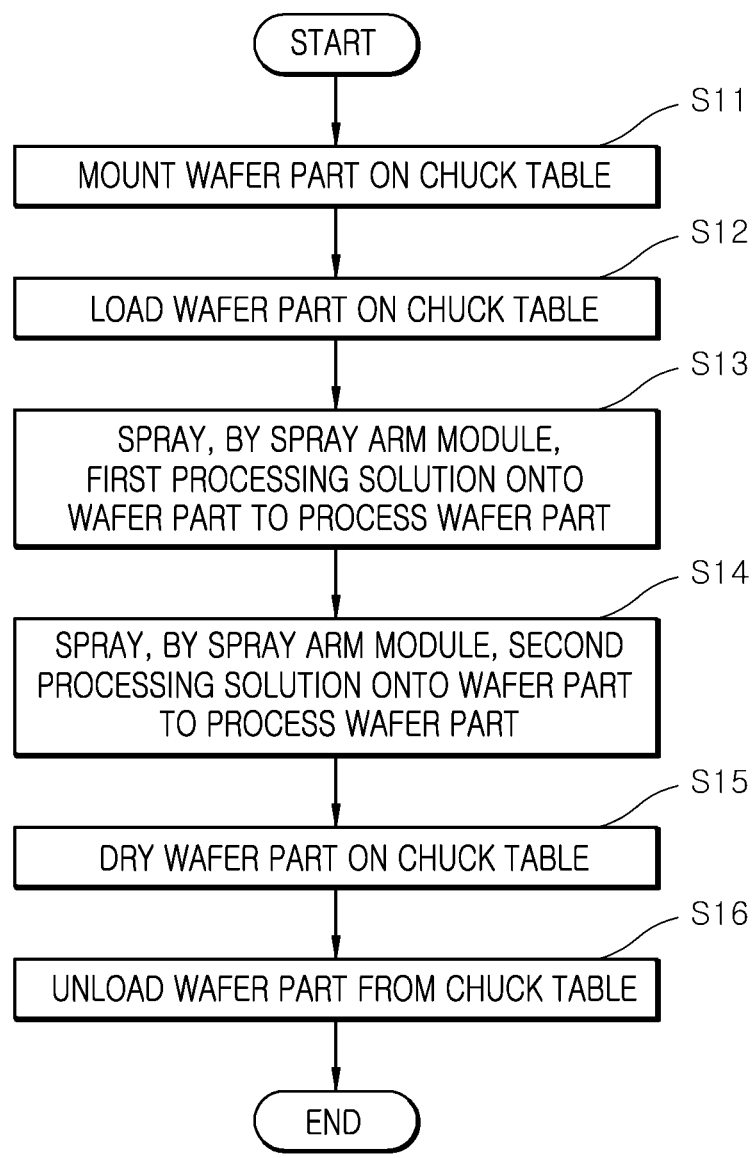
FIG. 27 is a schematic flowchart illustrating the wafer processing method according to one embodiment of the present invention.

FIGS. 26A to 26B show schematic views illustrating a wafer processing method according to one embodiment of the present invention. FIG. 27 is a schematic flowchart illustrating the wafer processing method according to one embodiment of the present invention.

Referring to FIGS. 26A to 26D, and 27, a wafer part 10 is mounted on a chuck table 320 and 330 (see FIG. 26A) (S11). In this case, a transfer device 100 holds the wafer part 10 transferred from a second transfer module 60 and is lowered to mount the wafer part 10 on the chuck table 320 and 330.

As a lifting unit 120 is driven, a transfer unit 130 is lifted, and a gripper unit 140 is drawn out of the transfer unit 130. In this case, a first rack gear portion 145 is fixed to a housing unit 131 of the transfer unit 130, and a second rack gear portion 146 is moved by the translation and rotation of a pinion portion 142. When a gripper driving part 141 is driven, the pinion portion 142 simultaneously performs translational motion and rotational motion along the first rack gear portion 145 so that the second rack gear portion 146 moves a distance twice a moving distance of the pinion portion 142 by the translational motion and rotational motion of the pinion portion 142. When the second transfer module 60 transfers the wafer part 10 to a finger part 147 of the gripper unit 140, the finger part 147 vacuum-adsorbs the wafer part 10 with a vacuum suction force.

Then, when the transfer unit 130 is lowered as the lifting unit 120 is driven, the wafer part 10 mounted on the finger part 147 is mounted on a vacuum chuck unit 330 of the chuck table 320 and 330. As a vacuum is formed in the vacuum chuck unit 330, the wafer part 10 is vacuum-adsorbed onto the vacuum chuck unit 330.

The wafer part 10 is loaded on the chuck table 320 and 330 (S12). In this case, as a chucking module 350 of the chuck table 320 and 330 is driven, a wafer restraining part 370 restrains a retainer ring portion 13 of the wafer part 10, and as a moving module 325 moves (lifts) a vacuum chuck unit 330 of the chuck table 320 and 330, the wafer part 10 is pulled in a radial direction thereof to widen gaps G2 between dies of the wafer part 10.

As a chucking rotating part 355 is driven, a base gear portion 354 is rotated to one side, and as a base body 352 is rotated to one side together with the base gear portion 354, first chucking link parts 360 and second chucking link parts 380 are moved in a radial direction of the base body 352. In this case, when the base body 352 of a chucking base 351 rotates, the plurality of first chucking link parts 360 and the plurality of second chucking link parts 380 simultaneously move. As the first chucking link parts 360 are moved, the retainer ring portion 13 of the wafer part 10 is restrained to the vacuum chuck unit 330 by a pressing gripper 375 of the wafer restraining part 370.

Then, when a moving medium such as gas is supplied to a medium flow path 326 of the moving module 325, a moving rod 327 is lifted by pressure of the moving medium to lift the vacuum chuck unit 330. As the vacuum chuck unit is lifted, an adhesive sheet 12 of the wafer part 10 is pulled in a radial direction thereof. As the adhesive sheet 12 is stretched in the radial direction, the gaps G2 between the plurality of dies widen.

A spray arm module 410 sprays a first processing solution onto the wafer part 10 to process the wafer part 10 (see FIG. 26B) (S13). In this case, the spray arm module 410 moves to be positioned above the wafer part 10 and swings within a certain angle range to spray the first processing solution onto the wafer part 10. The first processing solution is sprayed onto the wafer part 10 to process the wafer part 10. Here, pure water (DI water) is provided as the first processing solution.

The spray arm module 410 sprays a second processing solution onto the wafer part 10 to process the wafer part 10 (see FIG. 26C) (S14). In this case, the spray arm module 410 swings within a certain angle range to spray the second processing solution onto the wafer part 10. In addition, the chuck table 320 and 330 rotates the wafer part 10. A mixture of pure water and nitrogen ($N_2$) is provided as the second processing solution.

When cleaning by the second processing solution is completed, the supply of the second processing solution to the spray arm module 410 is stopped.

The wafer part 10 is dried on the chuck table 320 and 330 (see FIG. 26D) (S15). In this case, the spray arm module 410 is moved outward from the chuck table 320 and 330, and the chuck table 320 and 330 is rotated to dry the wafer part 10. As the chuck table 320 and 330 is rotated, the second processing solution attached to the wafer part 10 is discharged while flowing in a radial direction by a centrifugal force. Accordingly, it is possible to considerably reduce a drying time of the wafer part 10.

The wafer part 10 is unloaded from the chuck table 320 and 330 (S16). In this case, as the moving module 325 returns (lowers) the vacuum chuck unit 330 of the chuck table 320 and 330 to the original position thereof, the wafer part 10 is restored to the original state thereof, and as the chucking module 350 of the chuck table 320 and 330 is driven, the wafer restraining part 370 releases the restraint of the retainer ring portion 13 of the wafer part 10.

An operation of unloading the wafer part 10 from the chuck table 320 and 330 will be described in detail as follows. When a moving medium such as gas is discharged from the medium flow path 326 of the moving module 325, the moving rod 327 is lowered by releasing pressure of the moving medium to lower the vacuum chuck unit 330. As the vacuum chuck unit 330 is lowered, the adhesive sheet 12 of the wafer part 10 is contracted to the original state thereof. As the adhesive sheet 12 is contracted to the original state, the gaps G2 between the plurality of dies narrow to the original state thereof. Next, as the chucking rotating part 355 is driven, the base gear portion 354 is rotated to the other side, and as the base body 352 is rotated to the other side together with the base gear portion 354, the first chucking link parts 360 and the second chucking link parts 380 are moved in the radial direction of the base body 352. In this case, when the base body 352 of the chucking base 351 rotates, the plurality of first chucking link parts 360 and the plurality of second chucking link parts 380 simultaneously move. As the first chucking link parts 360 are moved, the retainer ring portion 13 of the wafer part 10 is released from the pressing gripper 375 of the wafer restraining part 370.

When the wafer part 10 is released from the restraint by the wafer restraining part 370, a discharge module (not shown) picks up and moves the wafer part 10 to the outside of the chuck table 320 and 330.

As described above, since the spray arm module 410 and the spray suction arm module 420 process the wafer part 10, the wafer part 10 can be processed using various types of processing solutions or cleaning solutions. Accordingly, a process of processing the wafer part 10 can be implemented in various ways according to types of processing solutions or cleaning solutions.

According to the present invention, even in a narrow space, a transfer device can receive a wafer part from a second transfer module, can mount the wafer part on a chuck table, and can unload the processed wafer part from the chuck table.

In addition, according to the present invention, as a tilting device is rotated, a ring cover unit can be easily restrained to and released from a chuck table device. In addition, a chucking module of the chuck table device can quickly restrain and release the ring cover unit. Accordingly, it is possible to shorten a processing and cleaning time of the wafer part.

In addition, according to the present invention, since a spray arm module and a spray suction arm module process the wafer part, the wafer part can be processed using various types of processing solutions or cleaning solutions. Accordingly, a process of processing the wafer part can be implemented in various ways.

In addition, according to the present invention, the chuck table device includes a wafer restraining part for restraining a retainer ring portion of the wafer part, a cover restraining part for restraining the ring cover unit, and a moving module for moving a vacuum chuck unit to pull the wafer part in a radial direction thereof. Accordingly, in a state in which the wafer restraining part restrains the retainer ring portion of the wafer part to the vacuum chuck unit and the moving module moves the vacuum chuck unit to widen gaps between dies of the wafer part, a wafer expanding process of processing the wafer part is possible. In addition, in a state in which the cover restraining part restrains the ring cover unit to an upper side of the vacuum chuck unit, a debonding cleaning process of processing the wafer part is possible.

In addition, according to the present invention, since the moving module moves the vacuum chuck unit to widen the gaps between the dies in the wafer part, foreign materials attached to surfaces of the dies as well as foreign materials positioned in the gaps between the plurality of dies can be easily removed by a cleaning solution. Accordingly, it is possible to considerably improve the cleaning performance for the wafer part and considerably reduce a defect rate of the wafer part.

While the present invention has been described with reference to embodiments shown in the drawings, these should be considered in a descriptive sense only, and it will be understood by those skilled in the art that various alterations and other equivalent embodiments may be made.

Accordingly, the true scope of protection of the present invention should be defined only by the appended claims.

What is claimed is:

1. A wafer processing method comprising:
mounting a wafer part on a chuck table;
loading the wafer part on the chuck table;
spraying, by a spray arm module, a first processing solution onto the wafer part to process the wafer part;
spraying, by the spray arm module, a second processing solution onto the wafer part to process the wafer part;
drying the wafer part on the chuck table; and
unloading the wafer part from the chuck table,
wherein the mounting of the wafer part on the chuck table includes:
holding the wafer part, by a transfer device including a lift, a transfer mechanism and a gripper, wherein the gripper includes a finger part which holds the wafer part through vacuum adsorption,
wherein the loading of the wafer part on the chuck table includes:
driving a chucking module including a base, a rotating part and a wafer restraining part of the chuck table and restraining, by the wafer restraining part, a retainer ring portion of the wafer part; and
moving, by a moving module including a moving rod and a cylinder or solenoid, a vacuum chuck unit of the chuck table and pulling the wafer part in a radial direction thereof to widen gaps between dies of the wafer part,
wherein the unloading of the wafer part from the chuck table includes:
returning, by the moving module, the vacuum chuck unit of the chuck table to an original position thereof to restore the wafer part to an original state thereof; and driving the chucking module of the chuck table and releasing, by the wafer restraining part, the restraint of the retainer ring portion of the wafer part.

2. The wafer processing method of claim 1, wherein the mounting of the wafer part on the chuck table further includes: lowering the transfer device to place the wafer part on the chuck table.

3. The wafer processing method of claim 1, wherein the spraying of the first processing solution onto the wafer part to process the wafer part includes:
moving the spray arm module to be positioned above the wafer part; and
swinging the spray arm module within a certain angle range to spray the first processing solution onto the wafer part.

4. The wafer processing method of claim 3, wherein the first processing solution is deionized (DI) water.

5. The wafer processing method of claim 1, wherein the spraying of the second processing solution onto the wafer part to process the wafer part includes swinging the spray arm module within a certain angle range to spray the second processing solution onto the wafer part.

6. The wafer processing method of claim 5, wherein the second processing solution is a mixture of deionized (DI) water and nitrogen ($N_2$).

7. The wafer processing method of claim 1, wherein the drying of the wafer part on the chuck table includes:
moving the spray arm module outward from the chuck table; and
rotating the chuck table to dry the wafer part.

* * * * *